United States Patent
Ohtani et al.

(10) Patent No.: US 7,202,497 B2
(45) Date of Patent: Apr. 10, 2007

(54) SEMICONDUCTOR DEVICE

(75) Inventors: Hisashi Ohtani, Kanagawa (JP);
Misako Nakazawa, Kanagawa (JP);
Satoshi Murakami, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 263 days.

(21) Appl. No.: 09/197,767

(22) Filed: Nov. 23, 1998

(65) Prior Publication Data
US 2002/0000613 A1 Jan. 3, 2002

(30) Foreign Application Priority Data
Nov. 27, 1997 (JP) ............................ 9-344350
Jan. 14, 1998 (JP) ............................ 10-018050

(51) Int. Cl.
*H01L 29/04* (2006.01)
*H01L 31/036* (2006.01)
*H01L 31/0376* (2006.01)
*H01L 31/20* (2006.01)

(52) U.S. Cl. ..................................... 257/59; 257/72

(58) Field of Classification Search ................ 257/347, 257/59, 72; 349/5, 43
See application file for complete search history.

(56) References Cited
U.S. PATENT DOCUMENTS

| | | | |
|---|---|---|---|
| 3,982,820 A | 9/1976 | Hattori et al. | |
| 4,640,583 A | 2/1987 | Hoshikawa et al. | |
| 4,796,979 A | 1/1989 | Tsuboyama | |
| 4,861,622 A | 8/1989 | Yamazaki et al. | |
| 4,911,958 A | 3/1990 | Mochizaki et al. | |
| 4,932,757 A | 6/1990 | Hanyu et al. | |
| 5,083,855 A | 1/1992 | Clark et al. | |
| 5,084,130 A | 1/1992 | Yamazaki et al. | |
| 5,117,299 A | 5/1992 | Kondo et al. | |
| 5,132,676 A | 7/1992 | Kimura et al. | |
| 5,148,259 A * | 9/1992 | Kato et al. ................. | 257/771 |
| 5,176,789 A | 1/1993 | Yamazaki et al. | |
| 5,189,540 A | 2/1993 | Nakamura et al. | |

(Continued)

FOREIGN PATENT DOCUMENTS

EP 0 404 575 12/1990

(Continued)

OTHER PUBLICATIONS

A.D.L. Chandani, et al., "Antiferroelectric Chiral Smectic Phases Responsible for the Tristable Switching in MHPOBC," Tokyo Inst. Of Tech., Jun. 12, 1989, pp. 34-37.

(Continued)

*Primary Examiner*—Phat X. Cao
(74) *Attorney, Agent, or Firm*—Eric J. Robinson; Robinson Intellectual Property Law Office, P.C.

(57) ABSTRACT

A semiconductor device and a process for producing the same, the semiconductor device comprising two conductive layers provided as separate layers, and an insulating layer sandwiched by the two conductive layers, in which the two conductive layers are electrically connected to each other with an embedded conductive layer or an oxide conductive layer provided as filling an opening formed in the insulating layer, and the embedded conductive layer comprises an organic resin film containing a conductive material dispersed therein or an inorganic film containing a conductive material dispersed therein.

42 Claims, 12 Drawing Sheets

U.S. PATENT DOCUMENTS

| | | | |
|---|---|---|---|
| 5,212,575 A | 5/1993 | Kojima et al. | |
| 5,227,900 A | 7/1993 | Inaba et al. | |
| 5,240,801 A | 8/1993 | Hayashi et al. | |
| 5,250,465 A * | 10/1993 | Iizuka et al. | 438/626 |
| 5,250,931 A | 10/1993 | Misawa et al. | |
| 5,270,846 A | 12/1993 | Watanabe et al. | |
| 5,305,126 A | 4/1994 | Xobayashi et al. | |
| 5,327,271 A | 7/1994 | Takeuchi et al. | |
| 5,330,616 A | 7/1994 | Yamazaki | |
| 5,332,521 A | 7/1994 | Yuasa et al. | |
| 5,339,306 A | 8/1994 | Yoshinaga et al. | |
| 5,354,497 A | 10/1994 | Fukuchi et al. | |
| 5,389,287 A | 2/1995 | Nishiyama et al. | |
| 5,391,258 A | 2/1995 | Brancaleoni et al. | |
| 5,412,493 A | 5/1995 | Kunii et al. | |
| 5,412,494 A | 5/1995 | Ishiwata et al. | |
| 5,430,320 A | 7/1995 | Lee | |
| 5,453,858 A | 9/1995 | Yamazaki | |
| 5,469,281 A | 11/1995 | Katakura et al. | |
| 5,473,449 A | 12/1995 | Takemura et al. | |
| 5,473,450 A | 12/1995 | Yamada et al. | |
| 5,490,001 A | 2/1996 | Konuma | |
| 5,495,353 A | 2/1996 | Yamazaki et al. | |
| 5,500,750 A | 3/1996 | Kanbe et al. | |
| 5,528,401 A | 6/1996 | Narutaki et al. | |
| 5,530,573 A | 6/1996 | Shimada | |
| 5,536,950 A | 7/1996 | Liu et al. | |
| 5,541,747 A | 7/1996 | Nishi et al. | |
| 5,546,208 A | 8/1996 | Shimizu et al. | |
| 5,552,913 A | 9/1996 | Shimizu et al. | |
| 5,562,529 A | 10/1996 | Kishii et al. | |
| 5,567,300 A | 10/1996 | Datta et al. | |
| 5,575,706 A | 11/1996 | Tsai et al. | |
| 5,583,369 A | 12/1996 | Yamazaki et al. | |
| 5,592,318 A | 1/1997 | Majima et al. | |
| 5,594,569 A | 1/1997 | Konuma et al. | |
| 5,616,934 A | 4/1997 | Dennison et al. | |
| 5,638,194 A | 6/1997 | Yamada et al. | |
| 5,643,826 A | 7/1997 | Ohtani et al. | |
| 5,644,370 A | 7/1997 | Miyawaki et al. | |
| 5,648,277 A | 7/1997 | Zhang et al. | |
| 5,652,667 A | 7/1997 | Kurogane | |
| 5,658,806 A | 8/1997 | Lin et al. | |
| 5,667,853 A | 9/1997 | Fukuyoshi et al. | |
| 5,706,064 A * | 1/1998 | Fukunaga et al. | 349/43 |
| 5,706,067 A | 1/1998 | Colgan et al. | |
| 5,717,224 A | 2/1998 | Zhang | |
| 5,739,882 A | 4/1998 | Shimizu et al. | |
| 5,739,890 A | 4/1998 | Uda et al. | |
| 5,757,054 A | 5/1998 | Miyawaki et al. | |
| 5,757,444 A | 5/1998 | Takemura | |
| 5,767,827 A | 6/1998 | Kobayashi et al. | |
| 5,790,222 A | 8/1998 | Kim | |
| 5,807,165 A | 9/1998 | Uzoh et al. | |
| 5,838,508 A | 11/1998 | Sugawara | |
| 5,877,832 A | 3/1999 | Shimada | |
| 5,899,547 A | 5/1999 | Yamazaki et al. | |
| 5,905,555 A | 5/1999 | Yamazaki et al. | |
| 5,907,376 A | 5/1999 | Shimada et al. | |
| 5,910,271 A | 6/1999 | Ohe et al. | |
| 5,917,571 A | 6/1999 | Shimada | |
| 5,933,204 A | 8/1999 | Fukumoto | |
| 5,933,205 A | 8/1999 | Yamazaki et al. | |
| 5,946,059 A | 8/1999 | Yamazaki et al. | |
| 5,946,561 A | 8/1999 | Yamazaki et al. | |
| 5,948,705 A * | 9/1999 | Jun | 438/734 |
| 5,949,107 A | 9/1999 | Zhang | |
| 5,956,105 A | 9/1999 | Yamazaki et al. | |
| 5,963,278 A | 10/1999 | Yamazaki et al. | |
| 5,976,393 A | 11/1999 | Abe | |
| 5,990,491 A | 11/1999 | Zhang | |
| 5,990,542 A * | 11/1999 | Yamazaki | 257/642 |
| 6,002,462 A | 12/1999 | Sato et al. | |
| 6,005,648 A | 12/1999 | Zhang et al. | |
| 6,008,876 A | 12/1999 | Moore | |
| 6,037,197 A | 3/2000 | Yamazaki et al. | |
| 6,043,149 A | 3/2000 | Jun | |
| 6,049,132 A | 4/2000 | Iwahashi et al. | |
| 6,081,305 A * | 6/2000 | Sato et al. | 349/5 |
| 6,081,310 A | 6/2000 | Katsuya et al. | |
| 6,097,453 A * | 8/2000 | Okita | 349/43 |
| 6,221,140 B1 | 4/2001 | Kobayashi et al. | |
| 6,242,343 B1 | 6/2001 | Yamazaki et al. | |
| 6,400,428 B1 * | 6/2002 | Izumi | 349/73 |

FOREIGN PATENT DOCUMENTS

| | | |
|---|---|---|
| EP | 0 733 931 | 9/1996 |
| EP | 0 738 012 | 10/1996 |
| JP | 57-020778 | 2/1982 |
| JP | 62-7022 | 1/1987 |
| JP | 63-198024 | 8/1988 |
| JP | 64-55527 | 3/1989 |
| JP | 01-120532 | 5/1989 |
| JP | 2-137819 | 5/1990 |
| JP | 2-503360 | 10/1990 |
| JP | 4-136814 | 5/1992 |
| JP | 04-220625 | 8/1992 |
| JP | 4-243228 | 8/1992 |
| JP | 4-362918 | 12/1992 |
| JP | 5-045636 | 2/1993 |
| JP | 5-297364 | 11/1993 |
| JP | 05-335424 | 12/1993 |
| JP | 6-40931 | 5/1994 |
| JP | 6-160812 | 6/1994 |
| JP | 6-160824 | 6/1994 |
| JP | 6-186533 | 7/1994 |
| JP | 6-214218 | 8/1994 |
| JP | 6-242409 | 9/1994 |
| JP | 6-289372 | 10/1994 |
| JP | 6-301015 | 10/1994 |
| JP | 6-301039 | 10/1994 |
| JP | 6-331948 | 12/1994 |
| JP | 6-337405 | 12/1994 |
| JP | 6-337418 | 12/1994 |
| JP | 6-347807 | 12/1994 |
| JP | 7-13143 | 1/1995 |
| JP | 07-098452 | 4/1995 |
| JP | 07-130848 | 5/1995 |
| JP | 07-135318 | 5/1995 |
| JP | 08-015686 | 1/1996 |
| JP | 08-076145 | 3/1996 |
| JP | 08-078329 | 3/1996 |
| JP | 08-101385 | 4/1996 |
| JP | 08-340120 | 12/1996 |
| JP | 09-080464 | 3/1997 |
| JP | 9-211462 | 8/1997 |
| JP | 09-230806 | 9/1997 |
| WO | WO 88/08552 | 11/1988 |

OTHER PUBLICATIONS

Michio Shimizu, et al., "Characteristic of a Novel Liquid Crystal Cell With Mixtue of FLC and U.V. Curable Resin," Mol. Cryst. Liq. Cryst., Overseas Publishers Association, vol. 263, 1995, pp. 585-587.

Inventors: Higuchi et al., Specification and Drawings of U.S. Appl. No. 09/198,751, (with Filing Receipt), filed Nov. 24, 1998, "Electrooptical Device, Method of Manufacturing the Same, and Electronic Equipment".

Notice of Rejection dated Oct. 17, 2006 for JP Application No. 0010-018050.

* cited by examiner

Etch Back Process

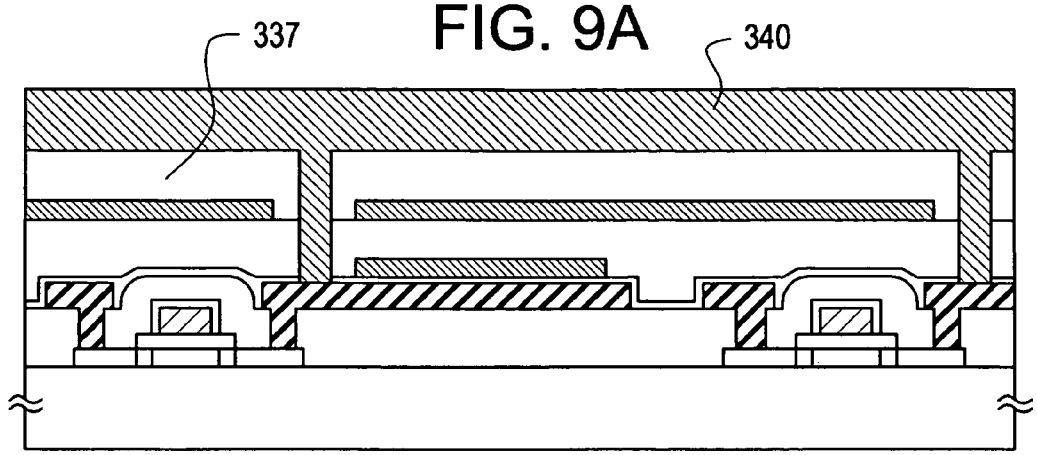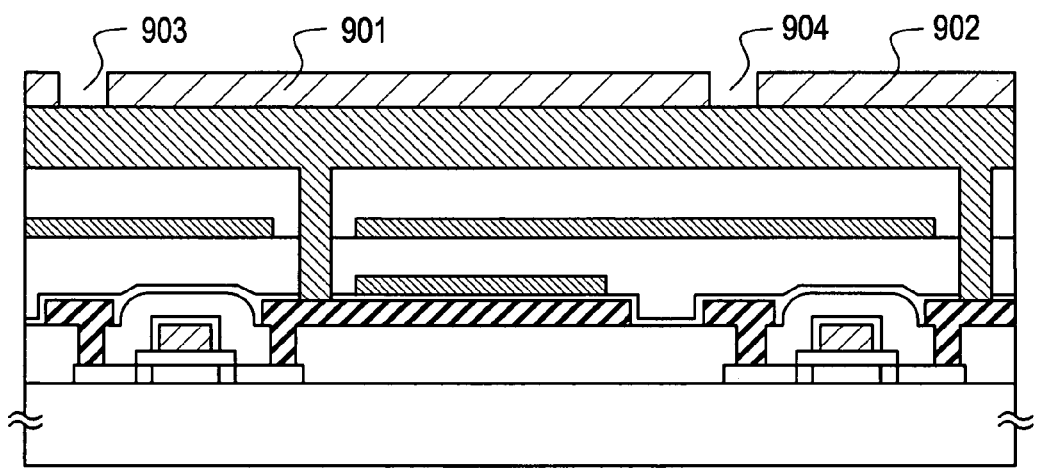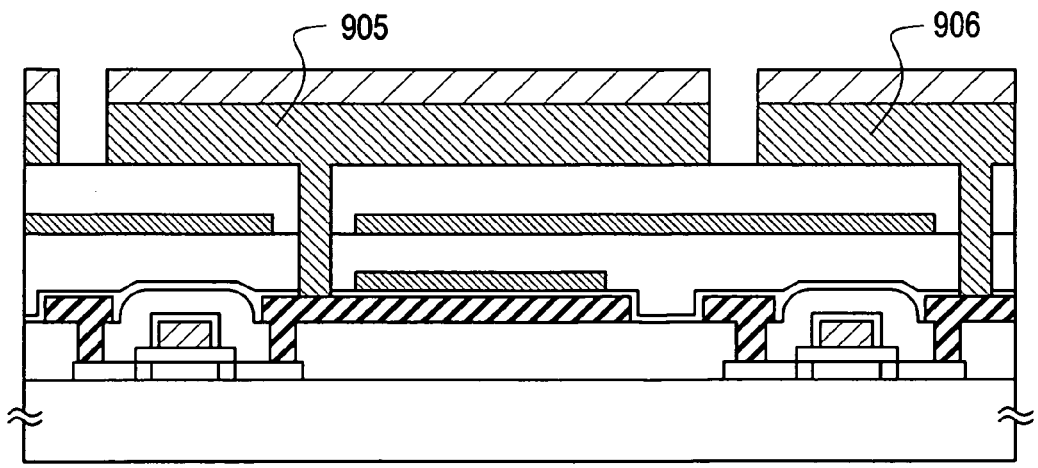

SEMICONDUCTOR DEVICE

FIELD OF THE INVENTION

The present invention relates to, in a semiconductor device using a thin film, a connection wiring ensuring electric connection between conductive thin films. Particularly, it relates to, in a pixel region of an active matrix liquid crystal display (AMLCD), a connection wiring ensuring electric connection between a switching element and a pixel electrode.

The semiconductor device used herein involves all devices functioning by utilizing semiconductor properties, and an electro-optical device such as an AMLCD and a semiconductor circuit such as a microprocessor are included. Furthermore, an electronic apparatus containing such an electro-optical device and a semiconductor circuit is also included in the semiconductor device.

BACKGROUND OF THE INVENTION

Recently, the technique of providing a TFT on an inexpensive glass substrate is being rapidly developed. This is because the demand of an AMLCD is increased.

In an AMLCD, each of several tens to several millions of pixels arranged in a matrix form is equipped with a thin film transistor (TFT) as a switching element, and input/output of an electric charge on each of pixel electrodes is controlled by the switching function of the TFT.

A liquid crystal is sandwiched between the pixel electrode and a counter electrode to form a kind of capacitor. Therefore, the electro-optical characteristics of the liquid crystal can be changed by controlling input/output of an electric charge on the capacitor, and thus an image can be displayed by controlling light passing through the liquid crystal panel.

As a characteristic phenomenon in such a display device using a liquid crystal, there is a phenomenon called disclination. While the liquid crystal sandwiched between the pixel electrode and the counter electrode is arranged with orientation having regularity, the orientation may be disturbed by rubbing failure due to unevenness on the surface of the electrodes. The function of light shutter is lost in the location at which disclination occurs, and display failure such as leakage of light arises.

In order to prevent disclination, measures have been conducted such as covering the TFT with a flattened film, but such cannot become drastic countermeasures because flattening of the contact part of the pixel electrode finally produced is impossible even if a flattened film is utilized.

The invention has been developed in view of the above-described problems.

DESCRIPTION OF THE INVENTION

An object of the invention is to provide a technique relating to a constitution of a contact part for forming a completely flat conductive layer.

Particularly, the invention intends to prevent generation of disclination due to a step of a contact part by completely flattening a pixel electrode of an AMLCD, whereby an effective pixel area is enlarged by reducing an area of a black mask, so as to realize an AMLCD of high precision and high contrast.

The invention relates to, as a first aspect, a semiconductor device comprising two conductive layers provided as separate layers, and an insulating layer sandwiched by the two conductive layers, the two conductive layers being connected to each other with an embedded conductive layer provided as filling an opening formed in the insulating layer, and the embedded conductive layer comprising an organic resin film containing a conductive material dispersed therein or an inorganic film containing a conductive material dispersed therein.

The invention also relates to, as a second aspect, a semiconductor device comprising two conductive layers provided as separate layers, and an insulating layer sandwiched by the two conductive layers, the two conductive layers being connected to each other with an oxide conductive layer provided as filling an opening formed in the insulating layer.

The invention further relates to, as a third aspect, a semiconductor device comprising two conductive layers provided as separate layers, and an insulating layer sandwiched by the two conductive layers, the two conductive layers being connected to each other with an embedded conductive layer provided as filling an opening formed in the insulating layer, the embedded conductive layer comprising an organic resin film containing a conductive material dispersed therein or an inorganic film containing a conductive material dispersed therein, and a shape of the opening substantially agreeing with a shape of the embedded conductive layer embedded in the opening.

The invention further relates to, as a fourth aspect, a semiconductor device comprising two conductive layers provided as separate layers, and an insulating layer sandwiched by the two conductive layers, the two conductive layers being connected to each other with an oxide conductive layer provided as filling an opening formed in the insulating layer, and a shape of the opening substantially agreeing with a shape of the oxide conductive layer embedded in the opening.

The invention further relates to, as a fifth aspect, a semiconductor device comprising two conductive layers provided as separate layers, and an insulating layer sandwiched by the two conductive layers, the two conductive layers being connected to each other with an embedded conductive layer provided as filling an opening formed in the insulating layer, the embedded conductive layer comprising an organic resin film containing a conductive material dispersed therein or an inorganic film containing a conductive material dispersed therein, and one of the two conductive layers being provided on a flat surface formed by the embedded conductive layer.

The invention further relates to, as a sixth aspect, a semiconductor device comprising two conductive layers provided as separate layers, and an insulating layer sandwiched by the two conductive layers, the two conductive layers being connected to each other with an oxide conductive layer provided as filling an opening formed in the insulating layer, and one of the two conductive layers being provided on a flat surface formed by the oxide conductive layer.

The invention further relates to, as a seventh aspect, a process for producing a semiconductor device comprising a step of forming a first conductive layer, a step of forming an insulating layer on the first conductive layer, a step of forming an opening in the insulating layer to expose the first conductive layer at a bottom of the opening, a step of forming an embedded conductive layer to cover the insulating layer and the opening, a step of etching or polishing the embedded conductive layer to make a state in that only the opening is filled with the embedded conductive layer, and a step of forming a second conductive layer on the insulating layer and the embedded conductive layer.

The invention further relates to, as a eighth aspect, a process for producing a semiconductor device comprising a step of forming a first conductive layer, a step of forming an insulating layer on the first conductive layer, a step of forming an opening in the insulating layer to expose the first conductive layer at a bottom of the opening, a step of forming an oxide conductive layer by a spin coating method to cover the insulating layer and the opening, a step of etching or polishing the oxide conductive layer to make a state in that only the opening is filled with the oxide conductive layer, and a step of forming a second conductive layer on the insulating layer and the oxide conductive layer.

The invention further relates to, as a ninth aspect, a process for producing a semiconductor device comprising a step of forming a first conductive layer, a step of forming an insulating layer on the first conductive layer, a step of forming an opening in the insulating layer to expose the first conductive layer at a bottom of the opening, a step of forming an embedded conductive layer to cover the insulating layer and the opening, a step of forming a second conductive layer on the embedded conductive layer, a step of patterning the second conductive layer to a desired pattern, and a step of etching the embedded conductive layer by using the second conductive layer as a mask in a self matching manner.

The invention further relates to, as a tenth aspect, a process for producing a semiconductor device comprising a step of forming a first conductive layer, a step of forming an insulating layer on the first conductive layer, a step of forming an opening in the insulating layer to expose the first conductive layer at a bottom of the opening, a step of forming an oxide conductive layer by a spin coating method to cover the insulating layer and the opening, a step of forming a second conductive layer on the oxide conductive layer, a step of patterning the second conductive layer to a desired pattern, and a step of etching the oxide conductive layer by using the second conductive layer as a mask in a self matching manner.

In the invention, by filling a contact hole with a conductive layer, improvement of the flatness of the second conductive layer (particularly the pixel electrode of the pixel matrix circuit) formed thereon is intended.

An organic resin film or an inorganic film, in which a material providing conductivity (conductive material) is dispersed, is used as the embedded conductive layer.

Examples of the material for the organic resin film include a polyimide resin, an acrylic resin, a polyamide resin, a polyimideamide resin, an epoxy resin and a polyvinyl alcohol (PVA) resin.

Examples of the inorganic film include a silicon dioxide film of a solution coating type called SOG (spin on glass). Specifically, OCD (Ohka Coating Diffusion source) produced by Tokyo Ohka Kogyo Co., Ltd. and general silicate glass (PSG, BSG and BPSG) can be exemplified.

As the material providing conductivity, a carbon material (such as graphite), zinc oxide, aluminum flakes and nickel flakes can be used. Particularly, graphite is preferred since it is good in general-purpose properties and handling properties. Those having a shape or a particle diameter that cannot fall into the opening provided in the insulating layer cannot be used.

Therefore, the material providing conductivity is preferably in the form of fine particles having a particle diameter of ½ or less (more preferably ¹⁄₁₀ or less, particularly preferably ¹⁄₁₀₀ or less) of the opening width of the opening provided in the insulating layer. For example, in the case where the opening has a diameter of 1 μm (contact hole) to connect the wiring (conductive layers), the material dispersed in the embedded conductive layer preferably has a diameter of 0.5 μm or less (more preferably 0.1 μm or less, particularly preferably 0.01 μm or less).

The inventors have selected a solution coating type conductive layer as a material that is preferred for filling in the fine contact hole, and have given attention to an ITO (indium tin oxide) film of a solution coating type as a representative material thereof.

Examples of the ITO film include a thin film produced by using ADEKA ITO coating solution produced by Asahi Denka Kogyo K. K. While an indium tin organic compound is dissolved in a xylene solvent to form this ITO coating solution, other oxide conductive layers can be formed by changing the solvent and the solute.

Since the oxide conductive layer is formed as concentrated at the uneven part, it is suitable for effectively filling and flattening the unevenness. The number of coating is not limited to once, and it is effective to coat twice or more to enhance the flatness.

BRIEF DESCRIPTION OF THE DRAWINGS

FIGS. 9A, 9B and 9C are schematic cross sectional views showing the production process of a pixel matrix circuit in Example 7 according to the invention.

DETAILED DESCRIPTION OF PREFERRED EMBODIMENTS

Figure 1A:
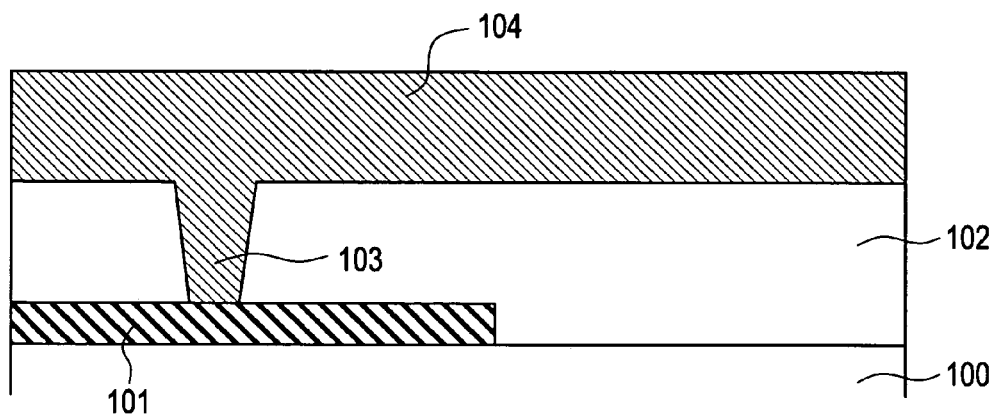
FIGS. 1A, 1B and 1C are schematic cross sectional views showing the production process of the connection structure of wiring according to one embodiment of the invention.

One embodiment of the invention is described with reference to FIGS. 1A to 1C. In FIG. 1A, numeral 100 denotes an underlayer, which may be any of an insulating layer, a semiconductor layer or a conductive layer, and a first conductive layer 101 having a pattern is formed thereon.

The first conductive layer 101 is covered with an insulating layer (interlayer insulating layer) 102. As the insulating layer 102, an insulating film containing silicon such as silicon oxide, silicon nitride and silicon oxide nitride, or an organic resin layer is used as a single layer or as having a multilayer structure. The case where an organic resin layer is provided as a single layer is described herein, for example.

After forming the insulating layer 102, an opening (contact hole) 103 is formed by etching. The method for etching may be a wet etching method or a dry etching method. It is effective that the cross sectional shape of the opening 103 is tapered to improve the coverage of a thin film subsequently formed.

After forming the opening 103, an embedded conductive layer 104 is formed. As the embedded conductive layer 104, an organic resin film containing a carbon material dispersed therein or an inorganic resin film containing a carbon material dispersed therein is used. A solution containing the carbon material dispersed therein is coated on the insulating layer 102, and an excess of the solution is removed by spin drying, to form the thin film. This technique is called a spin coating method.

After forming the embedded conductive layer 104 by the spin coating method, an excess of the solvent is removed by a baking (curing) step to improve the film quality depending on necessity. The conditions for the curing step are not limited, and baking (heat treatment) at 300° C. for 30 minutes is generally required.

The advantages of the thin film formed by coating a solution are that the film formation is extremely easy, and the film thickness can be easily increased. Furthermore, since the film is in the form of solution in the stage of film forming, it exhibits excellent covering properties of minute unevenness and is extremely suitable for filling a minute opening such as the contact hole. The invention has been attained with making attention to such excellent covering properties of a material of solution coating type.

Another advantage of the material of solution coating type is easiness of coloring. For example, a black colored organic resin film by dispersing a carbon series material is utilized as a black mask.

The inventor have made attention to the fact that among the organic resin films containing carbon material dispersed therein, an organic resin film using graphite as the carbon material becomes a film having a low resistance, and have found that it is used as the conductive layer for filling a contact hole, with combining the excellent covering properties of the material of solution coating type.

The state of FIG. 1A can be obtained after forming the embedded conductive layer 104. After that, the embedded conductive layer 104 is subjected to an etch back process by a dry etching method, to obtain a state in which the embedded conductive layer 104 fills only the opening 103, as shown in FIG. 1B.

In the etch back process, the etching selectivity of the insulating layer 102 and the embedded conductive layer should be noted. Since an organic resin film is used as the insulating film 102 in FIG. 1A, it is etched to the extent similar to the embedded conductive layer 104 in the etch back process, and no step is formed therebetween.

However, in the case where the insulating layer 102 is a silicon oxide film, the etch back process must be terminated at the time when the silicon oxide film is exposed, otherwise only the embedded conductive layer 104 is etched in the opening to form a step at the opening.

In view of the above, it is preferred that the insulating layer 102 and the embedded conductive layer 104 are in the conditions in that they have the same etching selectivity as possible. In order to accomplish such conditions, the etching conditions may be optimized or the same material is used in both the insulating layer 102 and the embedded conductive layer 104.

It is an important factor in the invention that the film thickness can be easily increased. In FIG. 1A, the thickness of the embedded conductive layer 104 must be the same as or thicker than the thickness of the insulating layer 102. Therefore, a CVD method and a sputtering method are not practical since the throughput is rather deteriorated by using these methods.

Figure 1B:
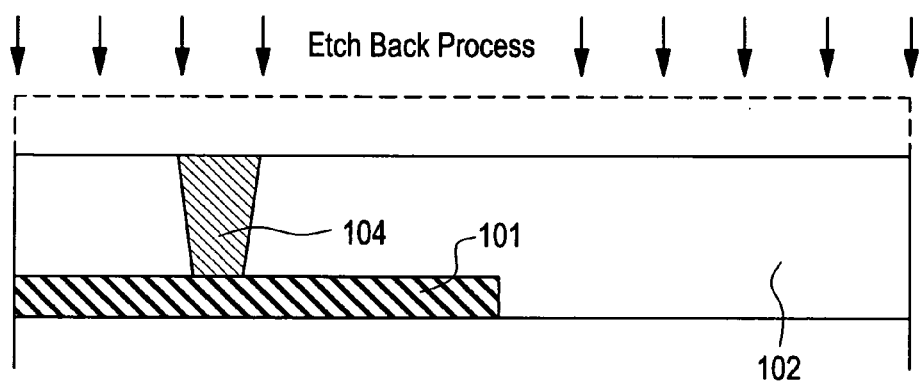
Figure 1C:
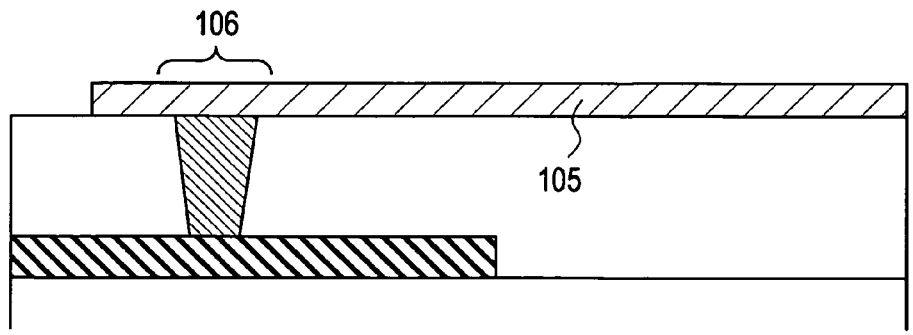

After thus obtaining the state shown in FIG. 1B, a second conductive layer 105 is formed to have a pattern. As a result, the two conductive layers (the first conductive layer 101 and the second conductive layer 105) insulatedly separated by the insulating layer 102 are electrically connected through the embedded conductive layer 104, as shown in FIG. 1C. The second conductive layer 105 can maintain complete flatness even at a contact part 106.

The invention having the above-described constitution is further described in detail with reference to the following examples.

EXAMPLE 1

Figure 2A:
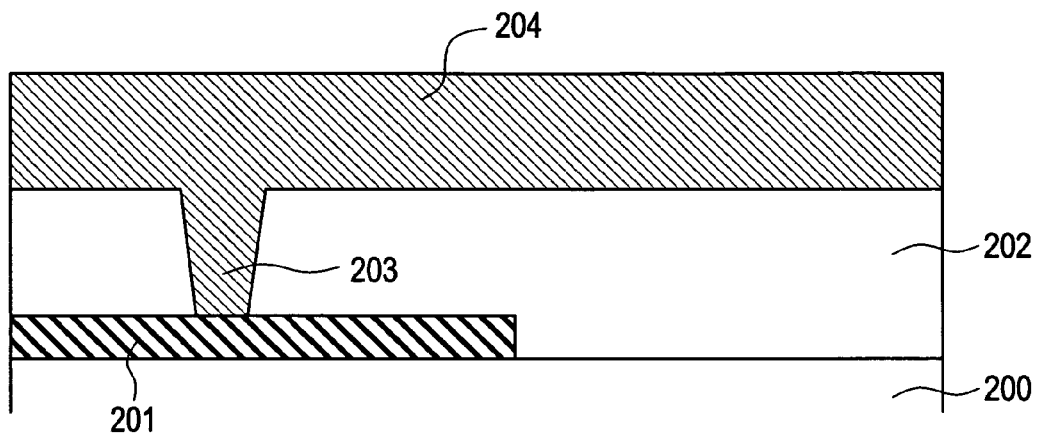
FIGS. 2A, 2B and 2C are schematic cross sectional views showing the production process of the connection structure of wiring in Example 1 according to the invention.

In this example, ITO is used as the embedded plug (conductive layer). In FIG. 2A, numeral 200 denotes an underlayer, which may be any of an insulating layer, a semiconductor layer or a conductive layer, and a first conductive layer 201 having a pattern is formed thereon.

The first conductive layer 201 is covered with an insulating layer (interlayer insulating layer) 202. As the insulating layer 202, an insulating film containing silicon such as silicon oxide, silicon nitride and silicon oxide-nitride, or an organic resin layer is used as a single layer or as having a multilayer structure.

After forming the insulating layer 202, an opening (contact hole) 203 is formed by etching. The method for etching may be a wet etching method or a dry etching method. It is effective that the cross sectional shape of the opening 203 is tapered to improve the coverage of a thin film subsequently formed.

After forming the opening 203, an oxide conductive layer 204 is formed. As the oxide conductive layer 204, an ITO film of solution coating type is used. A solution containing an indium tin organic compound dissolved in an organic solvent such as xylene is coated on the insulating layer 202, and an excess of the solution is removed by spin drying, to form the thin film. This technique is called a spin coating method.

After forming the oxide conductive layer 204, a drying step at a temperature of from 150 to 170° C. and a baking step at 300° C. or higher are conducted, and further an annealing step is conducted depending on necessity, to improve the film quality. The conditions of the curing step are not limited to the above, and the optimum conditions may be determined through experiments.

The advantages of the thin film formed by coating a solution are that the film formation is extremely easy, and the covering properties are excellent. That is, since the film is in the form of solution in the stage of film forming, it exhibits excellent covering properties of minute unevenness and is extremely suitable for filling a minute opening such as the contact hole. The invention has been attained with making attention to such excellent covering properties of a material of solution coating type.

In some cases, the ITO film of solution coating type can be colored black by adding a carbon series material or a pigment to the solution for coating the ITO film, and as a result, the light shielding property in the contact hole can be increased.

The state of FIG. 2A can be obtained after forming the oxide conductive layer 204. After that, the oxide conductive layer 204 is subjected to an etch back process by a dry etching method, to obtain a state in which the oxide conductive layer 204 fills only the opening 203, as shown in FIG. 2B.

In the case where an ITO film is used as the oxide conductive layer, either a wet etching method or a dry etching method may be employed for the etching method in the etch back process.

In the case where the wet etching method is employed, a commercially available etchant for ITO can be used. In the case where the dry etching method is employed, HBr (hydrogen bromide), HI (hydrogen iodide) and $CH_4$ (methane) can be used as an etching gas. Among these, HBr is preferred from the standpoint of workability and general-purpose properties.

Figure 2B:
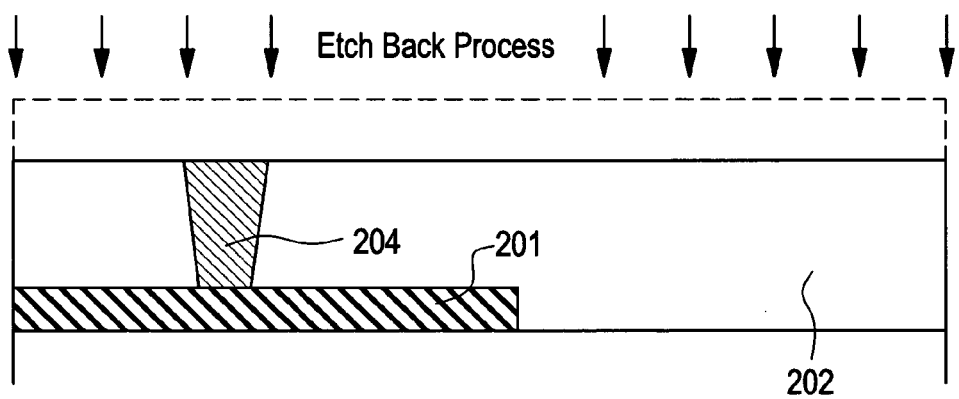
Figure 2C:
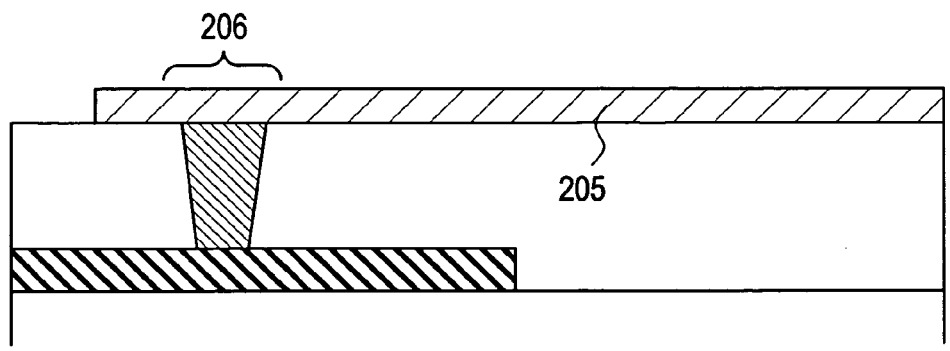

After thus obtaining the state shown in FIG. 2B, a second conductive layer 205 is formed to have a pattern. As a result, the two conductive layers (the first conductive layer 201 and the second conductive layer 205) insulatedly separated by the insulating layer 202 are electrically connected through the oxide conductive layer 204, as shown in FIG. 2C. The second conductive layer 205 can maintain complete flatness even at a contact part 206.

EXAMPLE 2

In this example, a production process of a unit pixel (unit picture element) constituting a pixel matrix circuit of an active matrix liquid crystal display device (AMLCD) driven in a reflection mode is described with reference to FIGS. 3A through 5C.

A quartz substrate 301 having an insulating surface is prepared. In this example, because a heat treatment at a temperature of from 900 to 1,000° C. is conducted, a material having high heat resistance must be used. A crystalline glass (glass ceramics) substrate provided with an underlayer film and a silicon substrate provided with a thermal oxidized film may be used.

An amorphous silicon film 302 having a thickness of 65 nm is formed thereon, and the amorphous silicon film 302 is crystallized by using the technique described in Unexamined Published Japanese Patent Application No. 8-78329. The technique described in this publication is to conduct selective crystallization by using a catalytic element accelerating crystallization.

A mask insulating film 303 is formed to selectively add a catalytic element (nickel in this example) to the amorphous silicon film 302. An opening 304 is formed in the mask insulating film 303.

A nickel acetate solution containing 10 ppm by weight of nickel is coated by the spin coating method, to form a catalytic element-containing layer 305.

Figure 3A:
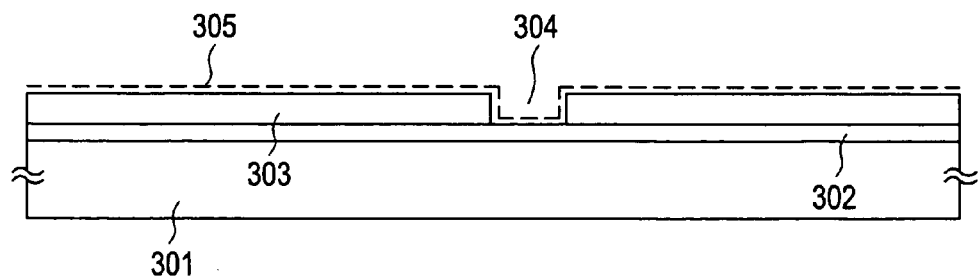
FIGS. 3A, 3B, 3C and 3D are schematic cross sectional views showing the production process of a pixel matrix circuit in Example 2 according to the invention.

After thus obtaining the state of FIG. 3A, removal of hydrogen is conducted at 450° C. for 1 hour, and a heat treatment is conducted at 570° C. for 14 hours, to obtain a lateral growing region 306. After thus finishing the crystallization step, an addition step of phosphorus is conducted by using the mask insulating film 303 itself as a mask, through which a phosphorus-added region 307 is formed.

Figure 3B:
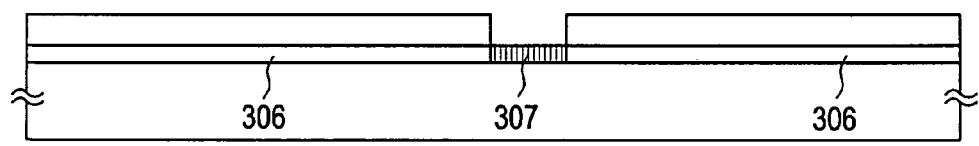
Figure 3C:
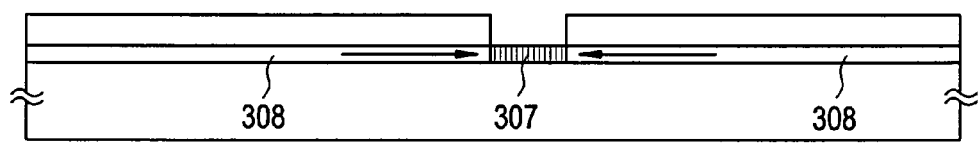

After thus obtaining the state of FIG. 3B, a heat treatment at 600° C. for 12 hours is conducted, so that nickel remaining in the lateral growing region 306 is subjected to gettering into the phosphorous-added region 307. As a result, a region in which the nickel concentration is lowered to $5 \times 10^{17}$ atoms/cm$^3$ (called a gettered region) 308 is obtained as shown in FIG. 3C.

Active layers 309 and 310 composed only of the gettered region 308 are formed by patterning, and then a gate insulating film 311 having a thickness of 120 nm is formed. The gate insulating film 311 is composed of a silicon oxide film, a silicon nitride film, a silicon oxide-nitride film, or a laminated film thereof.

Figure 3D:
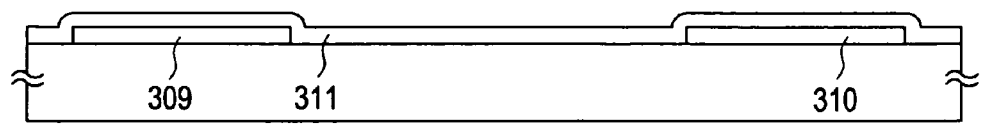

After forming the gate insulating film 311, a heat treatment at 950° C. for 30 minutes in an oxygen atmosphere is conducted to form a thermal oxidized film at the interface between the active layer and the gate insulating film, by which the interface properties can be largely improved. The active layer 309 and 310 are oxidized to be thinned through the thermal oxidation step. In this example, the thickness of the active layers is finally adjusted to 50 nm. That is, the thickness of the initial film (amorphous silicon film) is 65 nm, and oxidation is conducted for 15 nm, to result in a thermal oxidized film having a thickness of 30 nm. The gate insulating film 311 has a total thickness of 150 nm. The state until this step is shown in FIG. 3D. An aluminum film containing 0.2% by weight of scandium (not shown in figure) is formed, and an island pattern as a base of a gate electrode is formed by patterning. After forming the island pattern, the technique described in Unexamined Published Japanese Patent Application No. 7-135318 is applied, the details of which can be referred to the publication.

While a resist mask used for patterning remains on the island pattern, anodic oxidation is conducted in a 3% aqueous oxalic acid solution. A formation current of from 2 to 3 mV is applied using a platinum electrode as a cathode to a carry-over voltage of 8V. As a result, porous anodic oxidized films 312 and 313 are formed.

After removing the resist mask, anodic oxidation is conducted in a 3% ethylene glycol solution of tartaric acid neutralized with aqueous ammonia, at which the formation current is from 5 to 6 mV, and the carry-over voltage is 100V. As a result, dense non-porous anodic oxidized films 314 and 315 are formed.

Figure 4A:
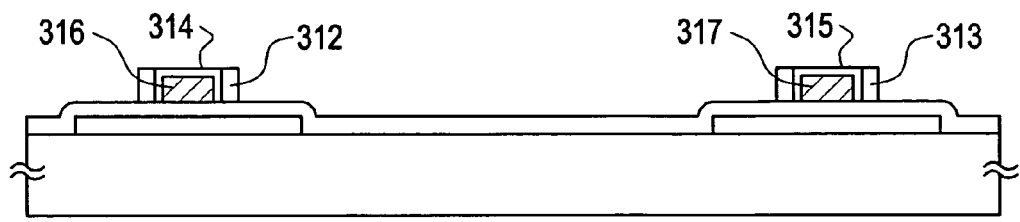
FIGS. 4A, 4B, 4C and 4D are schematic cross sectional views showing the production process of a pixel matrix circuit in Example 2 according to the invention.

Gate electrodes 316 and 317 are thus finished through the above-described procedures. In the pixel matrix circuit, gate lines connecting the gate electrodes per one line are formed simultaneously with the formation of the gate electrodes. The state until this step is shown in FIG. 4A.

Figure 4B:

The gate insulating film 311 is etched by using the gate electrodes 316 and 317 and the porous anodic oxidized films 312 and 313 as a mask. The etching is conducted by the dry etching method using $CF_3$ gas. As a result, the gate insulating films 318 and 319 having the shape shown in FIG. 4B are formed.

The porous anodic oxidized films 312 and 313 are removed by the wet etching method. The etching is conducted by using a mixed solution of phosphoric acid, acetic acid and nitric acid, the concentrations of which are 72.3% by weight ±0.1, 9.5% by weight ±1.0 and 2.0% by weight ±0.4, respectively, with water as a solvent.

An impurity ion endowing one conductivity is added by an ion injecting method or a plasma doping method. In the case where the pixel matrix circuit is constituted by an N-type TFT, P (phosphorus) ion is added, and in the case where it is constituted by a P-type TFT, B (boron) ion is added.

The addition of the impurity ion is conducted as separated into two steps. The first step is conducted at a high accelerating voltage of about 80 keV, with the peak of the impurity ion being focused at the lower part of the edge (protruding part) of the gate insulating films 318 and 319. The second step is conducted at a low accelerating voltage of about 5 keV in such a manner that the impurity ion is not added to the lower part of the edge (protruding part) of the gate insulating films 318 and 319.

As a result, source regions 320 and 321, drain regions 322 and 323, low concentration impurity regions (sometimes called an LDD region) 324 and 325, and channel formation regions 326 and 327 are formed, as shown in FIG. 4B.

The addition of the impurity ion is preferably conducted so that the sheet resistance of the source/drain region becomes from 300 to 500 Ω per square. The low concentration impurity regions must be optimized according to the performance of the TFT. After completing the addition step of the impurity ion, a heat treatment is conducted to activate the impurity ion.

A silicon oxide film having a thickness of 400 nm is formed as a first interlayer insulating film 328, and contact holes are formed to produce source electrodes 329 and 330 and drain electrodes 331 and 332. In this example, the drain electrodes 331 and 332 are formed as spread within the pixel.

This is a measure of obtaining a capacitance as large as possible, as the drain electrode is used as a lower electrode of an auxiliary capacitance. Because what is produced in this example is a reflection type liquid crystal display device, the lower part of the region at which the pixel electrode is formed later can be freely used without considering the aperture ratio.

Figure 4C:
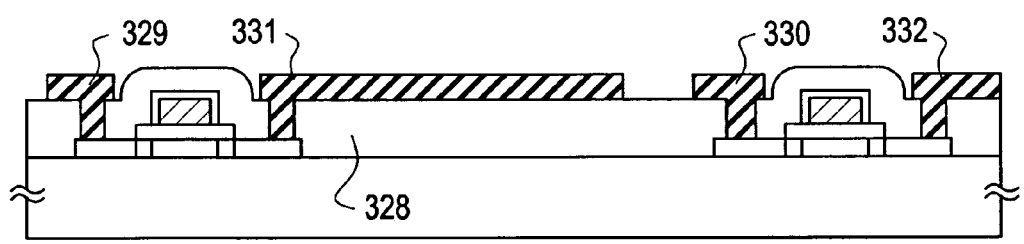

After thus obtaining the state shown in FIG. 4C, a silicon nitride film 333 having a thickness of 50 nm is formed as covering the source/drain electrodes, and a first metallic film (titanium in this example) 334 is formed thereon. In this example, an auxiliary capacitance is formed between the drain electrode 331 and the first metallic film 334 with using the silicon nitride film 333 as a dielectric material.

An acrylic resin film having a thickness of 1 μm is formed as a second interlayer insulating film 335. Other organic resin films, such as a polyimide resin film, may be used instead of the acrylic resin film. A second metallic film 336 is formed on the second interlayer insulating film 335.

While the second metallic film 336 has a function of a black mask, it mainly functions as an electric field shielding film, i.e., it has a function of protecting the pixel electrode formed later from influence of an electric field generated by the source/drain wiring.

Figure 4D:
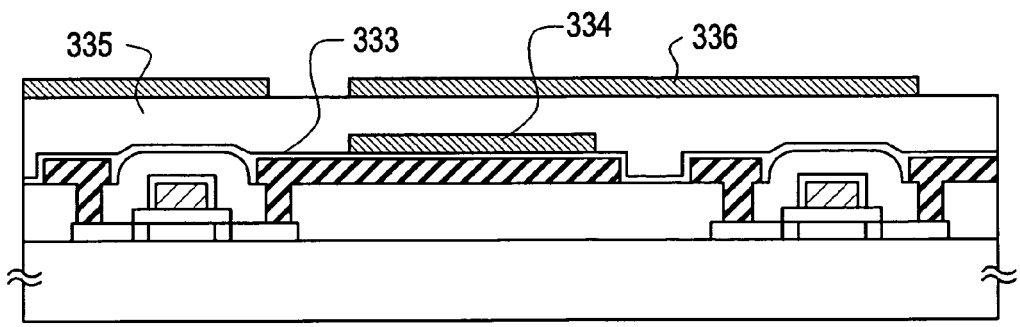
Figure 5A:
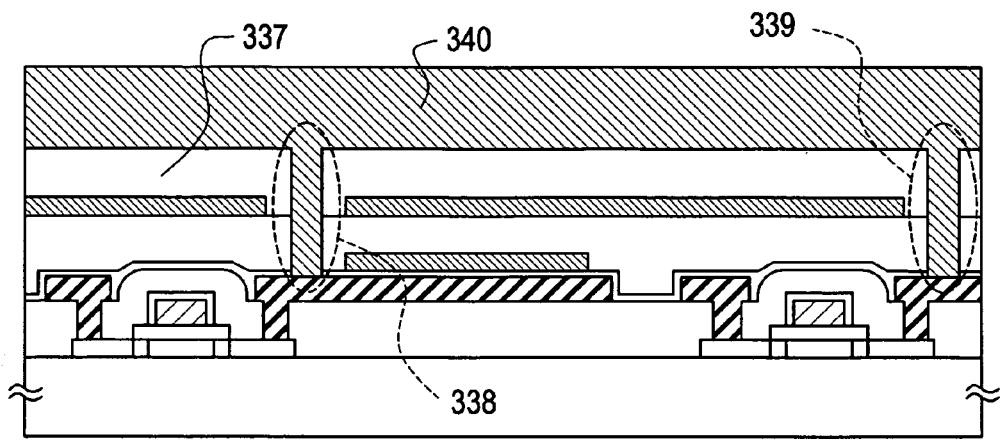
FIGS. 5A, 5B and 5C are schematic cross sectional views showing the production process of a pixel matrix circuit in Example 2 according to the invention.

After thus obtaining the state shown in FIG. 4D, an acrylic resin film having a thickness of 1 μm is formed as a third interlayer insulating film 337, and openings 338 and 339 are formed therein. An embedded conductive layer 340 is formed as covering the third interlayer insulating layer 337 and the openings 338 and 339, as shown in FIG. 5A.

In this example, an acrylic resin film containing graphite dispersed therein is used as the embedded conductive layer 340. Since the graphite dispersed in the embedded conductive layer 340 is in the form of flakes, it is sufficiently filled in the interior of the openings 338 and 339.

Figure 5B:
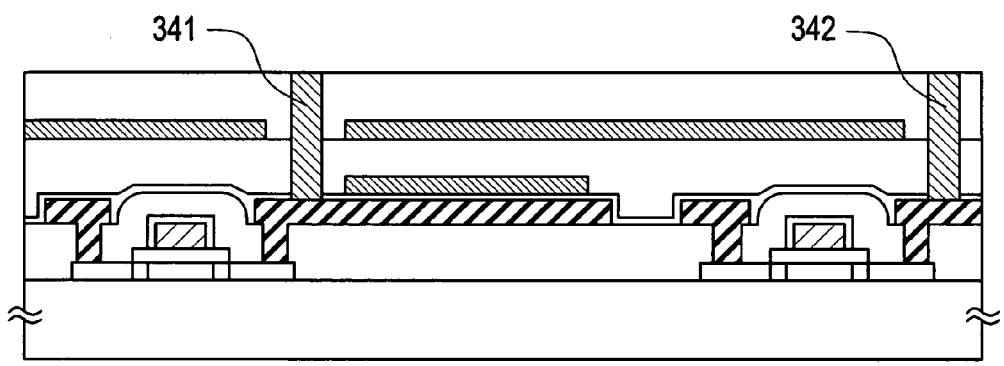

An etch back process is conducted by the dry etching method using an oxygen gas, to realize the state in that the openings 338 and 339 are filled with embedded conductive layers 341 and 342, as shown in FIG. 5B.

Figure 5C:
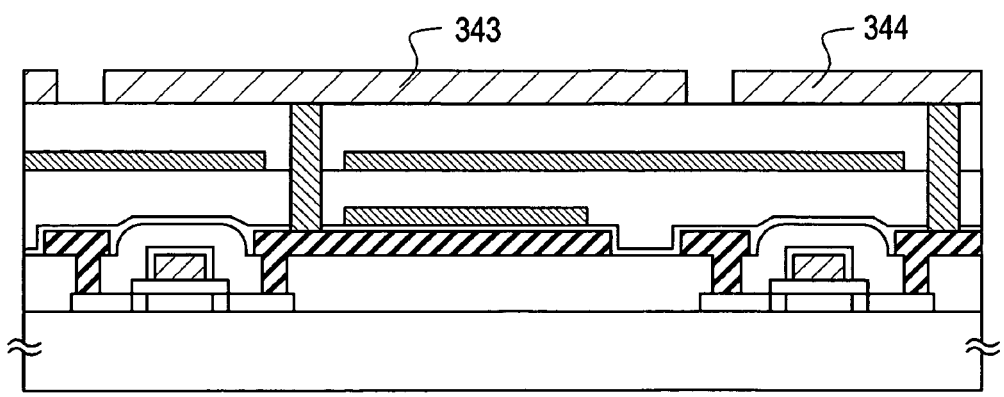

Pixel electrodes 343 and 344 composed of a material mainly comprising aluminum are formed on the third interlayer insulating film 337 that has been completely flattened by the embedded conductive layers 341 and 342. Because the interior of the contact holes (openings) is filled with the embedded conductive layers 341 and 342, electric connection to the drain electrodes can be realized without forming any step, as shown in FIG. 5C.

After that, an alignment film (not shown in figure) is formed on the pixel electrodes 343 and 344 to finish an active matrix substrate, which is one substrate of a liquid crystal display device. The active matrix substrate and a counter substrate prepared according to the conventional manner are fabricated into a cell to finish an active matrix liquid crystal display device.

EXAMPLE 3

In this example, a production process of a unit pixel constituting a pixel matrix circuit of an active matrix liquid crystal display device (AMLCD) driven in a reflection mode using ITO as an embedded plug (conductive layer) is described with reference to FIGS. 6A through 8C.

A quartz substrate 601 having an insulating surface is prepared. In this example, because a heat treatment at a temperature of from 900 to 1,100° C. is conducted, a material having high heat resistance must be used. A crystalline glass (glass ceramics) substrate provided with an underlayer film and a silicon substrate provided with a thermal oxidized film may be used.

An amorphous silicon film 602 having a thickness of 65 nm is formed thereon, and the amorphous silicon film 602 is crystallized by using the technique described in Unexamined Published Japanese Patent Application No. 8-78329. The technique described in this publication is to conduct selective crystallization by using a catalytic element accelerating crystallization.

A mask insulating film 603 is formed to selectively add a catalytic element (nickel in this example) to the amorphous silicon film 602. An opening 604 is formed in the mask insulating film 603.

A nickel acetate solution containing 10 ppm by weight of nickel is coated by the spin coating method, to form a catalytic element-containing layer 605.

Figure 6A:
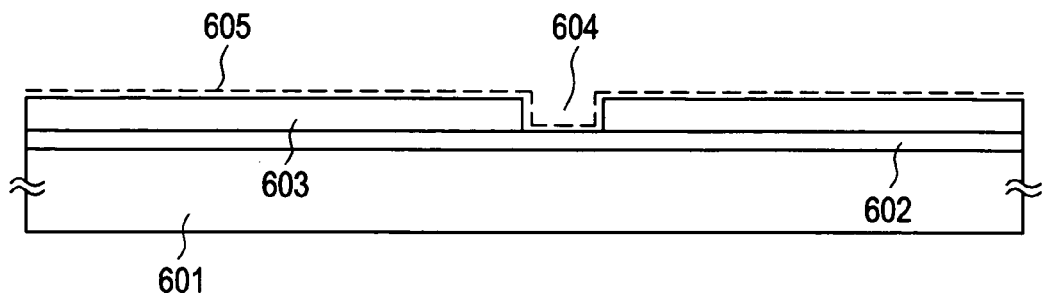
FIGS. 6A, 6B, 6C and 6D are schematic cross sectional views showing the production process of a pixel matrix circuit in Example 3 according to the invention.

After thus obtaining the state of FIG. 6A, removal of hydrogen is conducted at 450° C. for 1 hour, and a heat treatment is conducted at 570° C. for 14 hours, to obtain a lateral growing region 606. After thus finishing the crystallization step, an addition step of phosphorus is conducted by using the mask insulating film 603 itself as a mask, through which a phosphorus-added region 607 is formed.

Figure 6B:
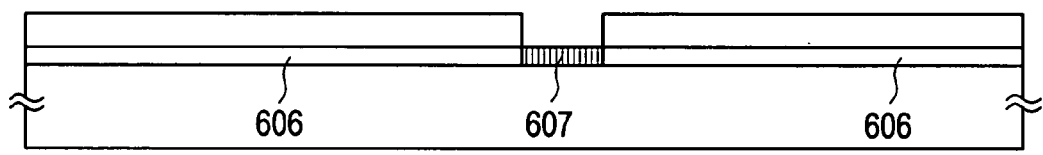
Figure 6C:
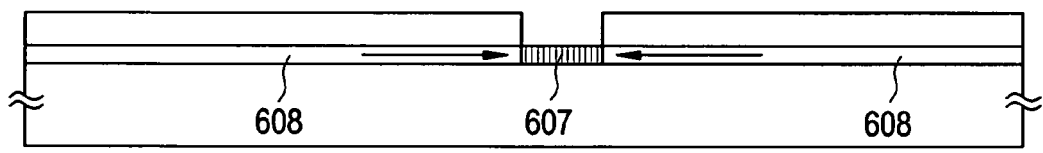

After thus obtaining the state of FIG. 6B, a heat treatment at 600° C. for 12 hours is conducted, so that nickel remaining in the lateral growing region 606 is subjected to gettering into the phosphorus-added region 607. As a result, a region in which the nickel concentration is lowered to $5 \times 10^{17}$ atoms/cm$^3$ (called a gettered region) 608 is obtained as shown in FIG. 6C.

Figure 6D:
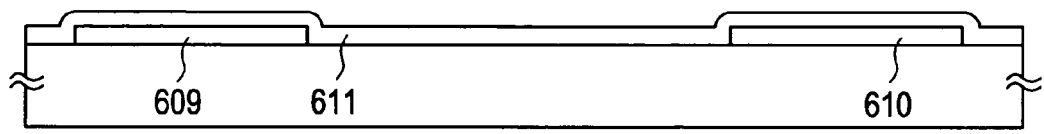

Active layers 609 and 610 composed only of the gettered region 608 are formed by patterning, and then a gate insulating film 611 having a thickness of 120 nm is formed, as shown in FIG. 6D. The gate insulating film 611 is composed of a silicon oxide film, a silicon nitride film, a silicon oxide nitride film, or a laminated film thereof.

After forming the gate insulating film 611, a heat treatment at 950° C. for 30 minutes in an oxygen atmosphere is conducted to form a thermal oxidized film at the interface between the active layer and the gate insulating film, by which the interface properties can be largely improved.

The active layer 609 and 610 are oxidized to be thinned through the thermal oxidation step. In this example, the thickness of the active layers is finally adjusted to 50 nm. That is, the thickness of the initial film (amorphous silicon film) is 65 nm, and oxidation is conducted for 15 nm, to result in a thermal oxidized film having a thickness of 30 nm. The gate insulating film 611 has a total thickness of 150 nm. An aluminum film containing 0.2% by weight of scandium (not shown in figure) is formed, and an island pattern as a base of a gate electrode is formed by patterning. After forming the island pattern, the technique described in Unexamined Published Japanese Patent Application No. 7-135318 is applied, the details of which can be referred to the publication.

While a resist mask used for patterning remains on the island pattern, anodic oxidation is conducted in a 3% aqueous oxalic acid solution. A formation current of from 2 to 3 mV is applied using a platinum electrode as a cathode to a carry-over voltage of 8V. As a result, porous anodic oxidized films 612 and 613 are formed.

After removing the resist mask, anodic oxidation is conducted in a 3% ethylene glycol solution of tartaric acid neutralized with aqueous ammonia, at which the formation current is from 5 to 6 mV, and the carry-over voltage is 100 V. As a result, dense non-porous anodic oxidized films 614 and 615 are formed.

Figure 7A:
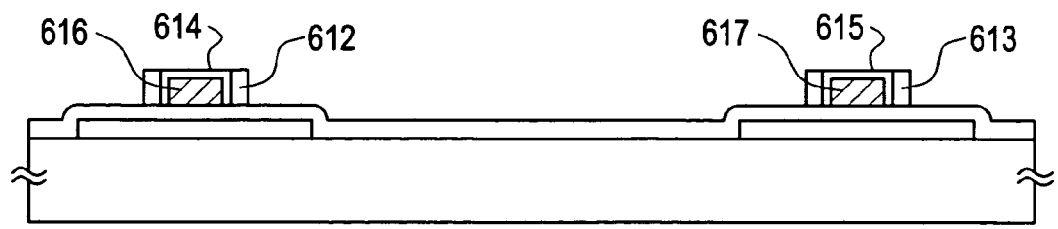
FIGS. 7A, 7B, 7C and 7D are schematic cross sectional views showing the production process of a pixel matrix circuit in Example 3 according to the invention.

Gate electrodes 616 and 617 are thus finished through the above-described procedures. In the pixel matrix circuit, gate lines connecting the gate electrodes per one line are formed simultaneously with the formation of the gate electrodes. The state until this step is shown in FIG. 7A.

Figure 7B:

The gate insulating film 611 is etched by using the gate electrodes 616 and 617 and the porous anodic oxidized films 612 and 613 as a mask. The etching is conducted by the dry etching method using CF$_3$ gas. As a result, the gate insulating films 618 and 619 having the shape shown in FIG. 7B are formed.

The porous anodic oxidized films 612 and 613 are removed by the wet etching method. The etching is conducted by using a mixed solution of phosphoric acid, acetic acid and nitric acid, the concentrations of which are 72.3% by weight ±0.1, 9.5% by weight ±1.0 and 2.0% by weight ±0.4, respectively, with water as a solvent.

An impurity ion endowing one conductivity is added by an ion injecting method or a plasma doping method. In the case where the pixel matrix circuit is constituted by an N-type TFT, P (phosphorous) ion is added, and in the case where it is constituted by a P-type TFT, B (boron) ion is added.

The addition of the impurity ion is conducted as separated into two steps. The first step is conducted at a high accelerating voltage of about 80 keV, with the peak of the impurity ion being focused at the lower part of the edge (protruding part) of the gate insulating films 618 and 619. The second step is conducted at a low accelerating voltage of about 5 keV in such a manner that the impurity ion is not added to the lower part of the edge (protruding part) of the gate insulating films 618 and 619.

As a result, source regions 620 and 621, drain regions 622 and 623, low concentration impurity regions (sometimes called an LDD region) 624 and 625, and channel formation regions 626 and 627 are formed, as shown in FIG. 7B.

The addition of the impurity ion is preferably conducted so that the sheet resistance of the source/drain region becomes from 300 to 500 Ω per square. The low concentration impurity regions must be optimized according to the performance of the TFT. After completing the addition step of the impurity ion, a heat treatment is conducted to activate the impurity ion.

A silicon oxide film having a thickness of 400 nm is formed as a first interlayer insulating film 628, and contact holes are formed to produce source electrodes 629 and 630 and drain electrodes 631 and 632. In this example, the drain electrodes 631 and 632 are formed as spread within the pixel.

This is a measure of obtaining a capacitance as large as possible, as the drain electrode is used as a lower electrode of an auxiliary capacitance. Because what is produced in this example is a reflection type liquid crystal display device, the lower part of the region at which the pixel electrode is formed later can be freely used without considering the aperture ratio.

Figure 7C:
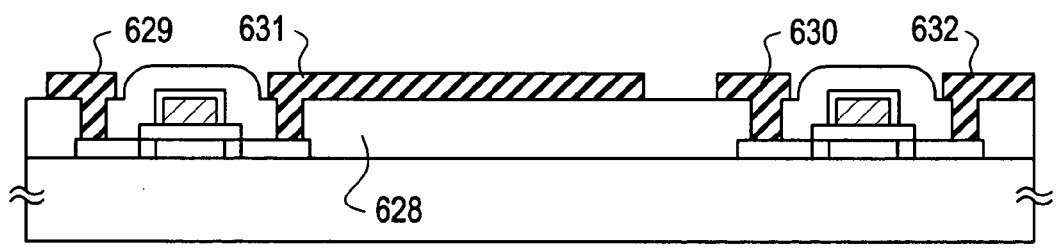

After thus obtaining the state shown in FIG. 7C, a silicon nitride film 633 having a thickness of 50 nm is formed as covering the source/drain electrodes, and a first metallic film (titanium in this example) 634 is formed thereon. In this example, an auxiliary capacitance is formed between the drain electrode 631 and the first metallic film 634 with using the silicon nitride film 633 as a dielectric material.

A polyimide resin film having a thickness of 1 μm is formed as a second interlayer insulating film 635. Other organic resin films, such as an acrylic resin film, may be used instead of the polyimide resin film. A second metallic film 636 is formed on the second interlayer insulating film 635.

While the second metallic film 636 has a function of a black mask, it mainly functions as an electric field shielding film, i.e., it has a function of protecting the pixel electrode formed later from influence of an electric field generated by the source/drain wiring.

Figure 7D:
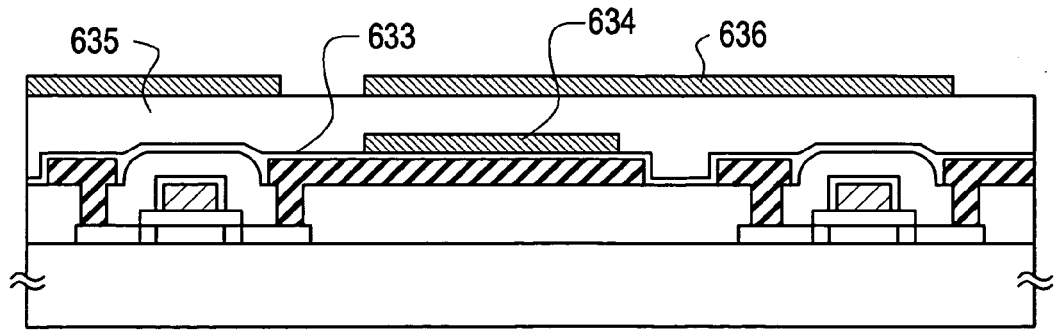
Figure 8A:
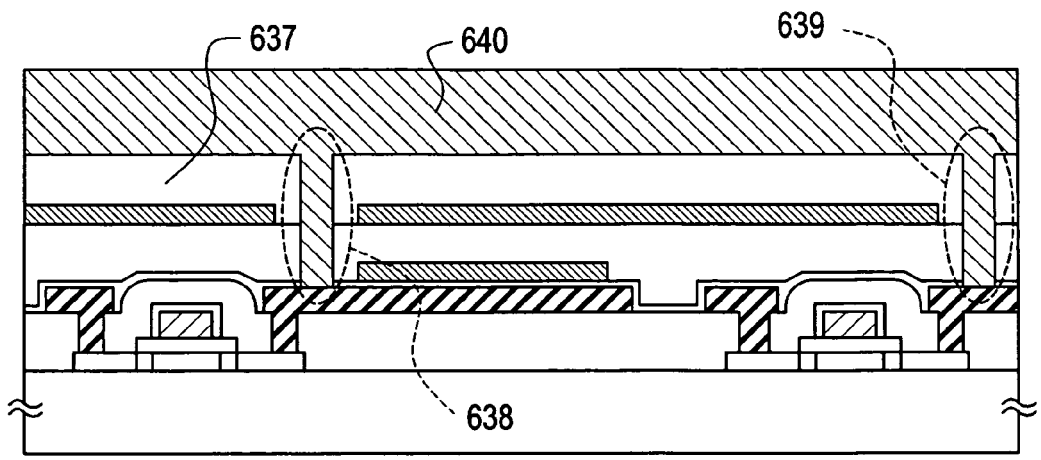
FIGS. 8A, 8B and 8C are schematic cross sectional views showing the production process of a pixel matrix circuit in Example 3 according to the invention.

After thus obtaining the state shown in FIG. 7D, a polyimide resin film having a thickness of 1 μm is formed as a third interlayer insulating film 637, and openings 638 and 639 are formed therein. An oxide conductive layer 640 is formed as covering the third interlayer insulating layer 637 and the openings 638 and 639, as shown in FIG. 8A.

In this example, a coating type ITO film having a viscosity of from 10 to 30 cps (produced by Asahi Denka Kogyo K. K.) is used as the oxide conductive layer 640. After coating the solution by the spin coating method, it is subjected to a drying step at a temperature of from 150 to 200° C. for from 5 to 10 minutes and a baking step at a temperature of from 300 to 400° C. for from 1 to 2 hours, to improve the film quality. The treatments for improving the film quality is not limited to those conducted in this example.

It is also effective to conduct annealing at a high temperature after the baking step. On conducting annealing, the heat resistance of the material of the electrodes must be considered. In order to avoid the whole of the device subjected to annealing at a high temperature, lamp annealing or the like measure are preferably employed.

The resistance of the oxide conductive layer 640 becomes 1 kΩ per square or less by conducting such a treatment for improving the film quality. It is considered this order of the resistance is enough to ensure electric connection of a submicron distance.

The thickness of the oxide conductive layer 640 can be controlled by the viscosity of the solution, and the rotation number and the rotation speed on spin coating. The thickness must be changed depending on the diameter of the contact holes (opening area), and it is enough to adjust the thickness within the range of from 100 to 500 nm (typically from 150 to 300 nm) to sufficiently fill up the interior of the contact holes.

Figure 8B:
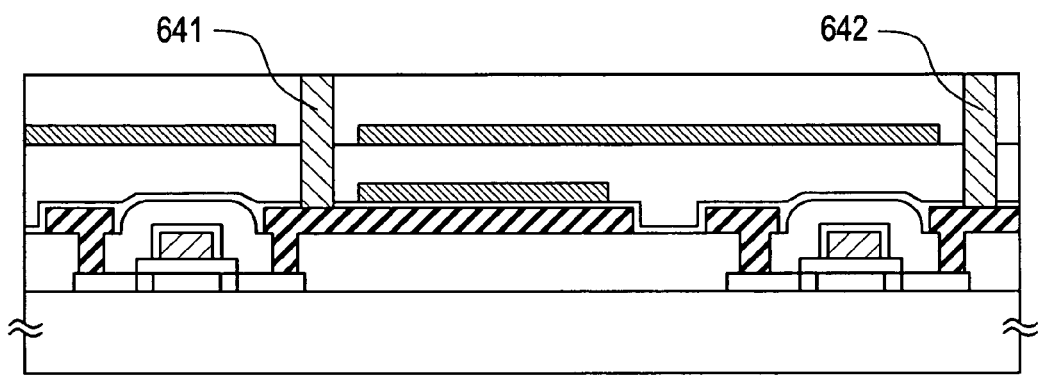

An etch back process is conducted by the dry etching method using an etching gas selected from HBr, HI and $CH_4$ diluted with Ar (argon). In this example, HBr is employed. As a result, the state in that the openings 638 and 639 are filled with oxide conductive layers 641 and 642 is realized, as shown in FIG. 8B.

Figure 8C:
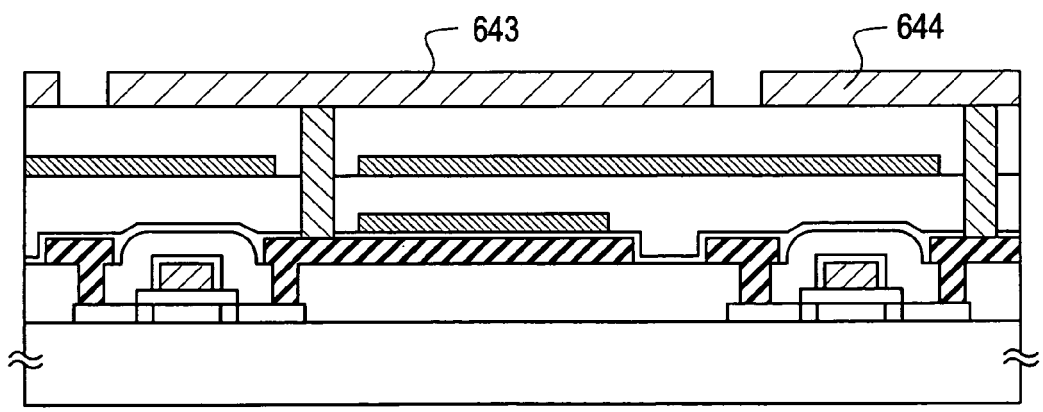

Pixel electrodes 643 and 644 composed of a material mainly comprising aluminum are formed on the third interlayer insulating film 637 that has been completely flattened by the oxide conductive layers 641 and 642. Because the interior of the contact holes (openings) is filled with the oxide conductive layers 641 and 642, electric connection to the drain electrodes can be realized without forming any step, as shown in FIG. 8C.

After that, an alignment film (not shown in figure) is formed on the pixel electrodes 643 and 644 to finish an active matrix substrate, which is one substrate of a liquid crystal display device. The active matrix substrate and a counter substrate prepared according to the conventional manner are fabricated into a cell to finish an active matrix liquid crystal display device.

EXAMPLE 4

While the etch back treatment is applied to the embedded conductive electrode or the oxide conductive electrode in Examples 1 to 3, a polishing treatment can be employed instead of the etch back treatment. A technique called CMP (chemical mechanical polishing) can be typically employed.

In the case where this technique is employed, dusts generated during the treatment should be carefully managed. By using this technique, excellent flatness can be ensured even when the third interlayer insulating film and the embedded conductive layer are formed of different materials.

EXAMPLE 5

In Example 2, an acrylic resin layer is employed as the third interlayer insulating film 337, and the main component of the embedded conductive layer is an acrylic resin. Other organic resins, such as a polyimide resin, may be used as the main component of the embedded conductive layer.

In the case where a silicon oxide film is used as the third interlayer insulating film, it is effective to use a silicon oxide film of solution coating type called SOG as the main component of the embedded conductive layer. In this case, a carbon material, such as graphite, is dispersed in the solution, and the film formation can be conducted by the spin coating method.

The third interlayer insulating film and the embedded conductive layer may be formed of different materials. In such a case, measures should be taken not to form a step at the opening after the etch back treatment.

EXAMPLE 6

While an polyimide film is used as the second and third interlayer insulating films in Example 3, it is effective to use a silicon oxide film or a silicon oxide-nitride film therefor.

Since an organic resin film, such as the polyimide film, only has low heat resistance, the baking temperature of the oxide conductive layer and the subsequent annealing temperature are limited. However, by constituting the interlayer insulating film with a silicon oxide film, etc., annealing at a higher temperature can be realized to obtain a film having further improved film quality.

Since a material mainly composed of aluminum is used as the gate electrode and the source/drain electrode in Example 3, the heat resistance of that material should be considered. However, when a material having high heat resistance is used as the material for the electrodes, an annealing treatment at a high temperature exceeding 500° C. can be conducted.

Examples of the material having high heat resistance that can be used as the material for the electrodes in Example 3 include tantalum, tungsten, molybdenum and a silicon film endowed with conductivity.

Furthermore, the constitution in this example and that of Example 4 may be combined.

EXAMPLE 7

In this example, a technique for producing a reflection type AMLCD having a constitution different from Example 2 is described with reference to FIGS. 9A through 9C.

The state shown in FIG. 9A is obtained according to the procedures of Example 2. In FIG. 9A, numeral 337 denotes the third interlayer insulating film, and 340 denotes the embedded conductive layer.

Pixel electrodes 901 and 902 composed of a material mainly comprising aluminum are formed on the embedded conductive layer 340. The pixel electrodes 901 and 902 are physically insulated from each other by openings 903 and 904, as shown in FIG. 9B.

The embedded conductive layer 340 is etched by using the pixel electrodes 901 and 902 as a mask, to form embedded conductive layers 905 and 906 patterned into the same shape as the pixel electrodes. The embedded conductive layers 905 and 906 are also physically insulated from each other and thus function as a part of the pixel electrodes, as shown in FIG. 9C.

According to the constitution of this example, while the openings (corresponding to 903 and 904) separating the pixel electrodes 901 and 902 have a depth of 1 μm or more, this does not bring about any problem since this part positions above the source electrode (source wiring) and is shielded from light. Furthermore, disclination is concentrated at this part, and thus an effect of preventing disclination spreading to the necessary region in the pixel (pinning effect) can also be expected.

EXAMPLE 8

In this example, a technique for producing a reflection type AMLCD having a constitution different from Example 3 is described with reference to FIGS. 10A through 10C.

Figure 10A:
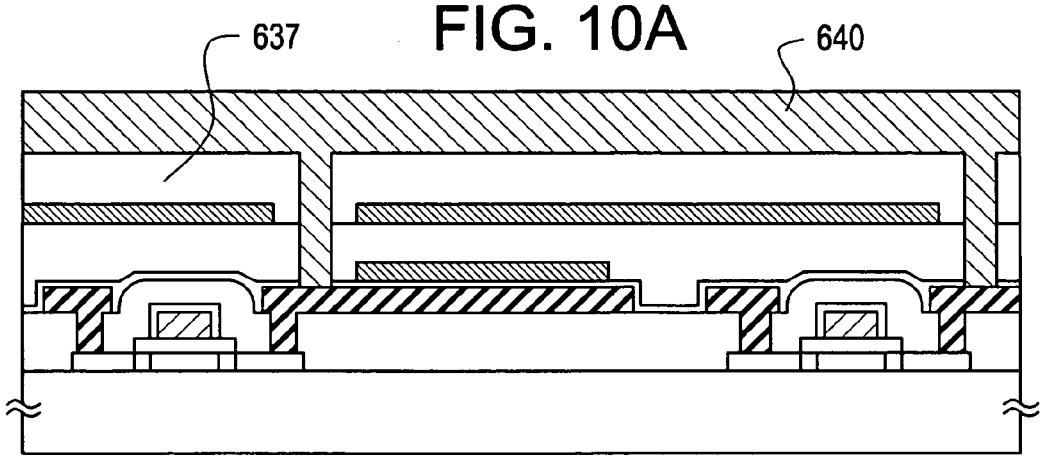
FIGS. 10A, 10B and 10C are schematic cross sectional views showing the production process of a pixel matrix circuit in Example 8 according to the invention.
Figure 10B:
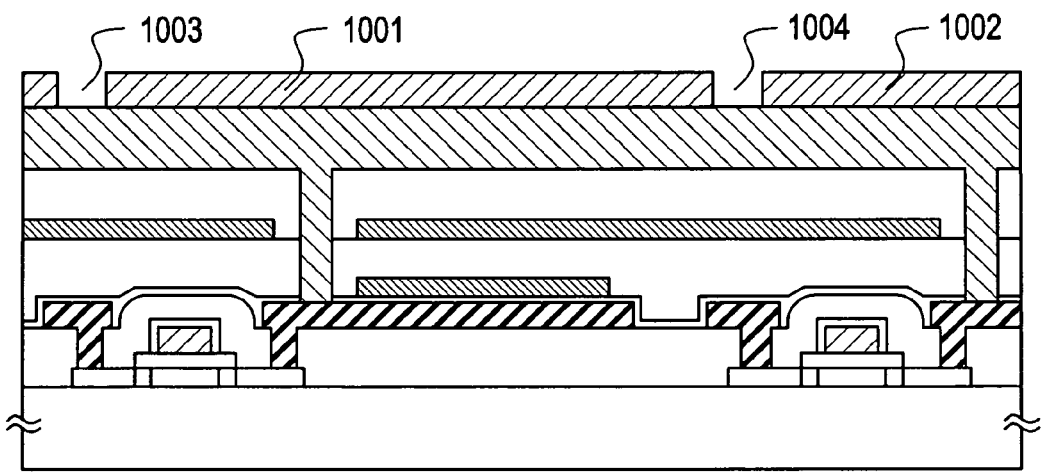
Figure 10C:
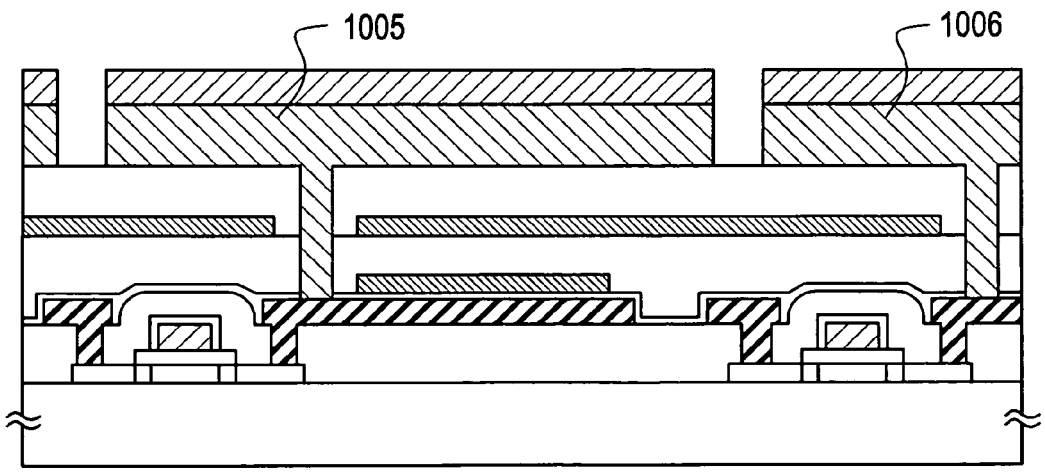

The state shown in FIG. 10A is obtained according to the procedures of Example 3. In FIG. 10A, numeral 637 denotes the third interlayer insulating film, and 640 denotes the oxide conductive layer.

Pixel electrodes 1001 and 1002 composed of a material mainly comprising aluminum are formed on the oxide conductive layer 640. The pixel electrodes 1001 and 1002 are physically insulated from each other by openings 1003 and 1004, as shown in FIG. 10B.

The oxide conductive layer 640 is etched by using the pixel electrodes 1001 and 1002 as a mask, to form oxide conductive layers 1005 and 1006 patterned into the same shape as the pixel electrodes. The oxide conductive layers 1005 and 1006 are also physically insulated from each other and thus function as a part of the pixel electrodes, as shown in FIG. 10C.

According to the constitution of this example, while the openings (corresponding to 1003 and 1004) separating the pixel electrodes 1001 and 1002 have a depth of 1 μm or more, this does not bring about any problem since this part positions above the source electrode (source wiring) and is shielded from light. Furthermore, disclination is concentrated at this part, and thus an effect of preventing disclination spreading to the necessary region in the pixel (pinning effect) can also be expected.

Furthermore, the constitution in this example and that of Example 6 may be combined.

EXAMPLE 9

While a TFT having a top gate structure (a planer type herein) is exemplified in Examples 1 to 8, the invention can be easily applied to a TFT having a bottom gate structure (typically a reverse stagger type).

The invention can be applied to not only a TFT but also connection wiring of a MOSFET formed on a single crystal silicon wafer.

As described in the foregoing, the invention can be applied to a device having any structure that requires to connect plural pieces of wiring formed on different layers.

EXAMPLE 10

While an AMLCD driven in a reflection mode is exemplified in Examples 1 to 9, the invention can be applied to an AMLCD driven in a transmission mode. In this case, the constitutions shown in Examples 7 and 8 cannot be applied since the whole of the pixel is shielded from light, but the constitutions shown in Examples 2 and 3 (constitutions in which the embedded conductive layer is filled only in the opening) can sufficiently applied.

In order to produce a transmission type AMLCD, a transparent conductive film (typically an ITO film and a tin oxide film) is used as the pixel electrode.

In the case where a transmission type LCD is produced, when the pixel electrode (transparent conductive film) and the active layer is directly connected to each other, there arises a problem of leakage of light from the contact part. Even in such a case, the opening is filled with the embedded conductive layer to shield the opening from light, and thus the leakage of light can be prevented.

EXAMPLE 11

In this example, an AMLCD fabricated by using the active matrix substrate (substrate on which elements are formed) having the constitution shown in Examples 1 to 10 are exemplified. The appearance of the AMLCD of this example is shown in FIGS. 11A and 11B.

Figure 11A:
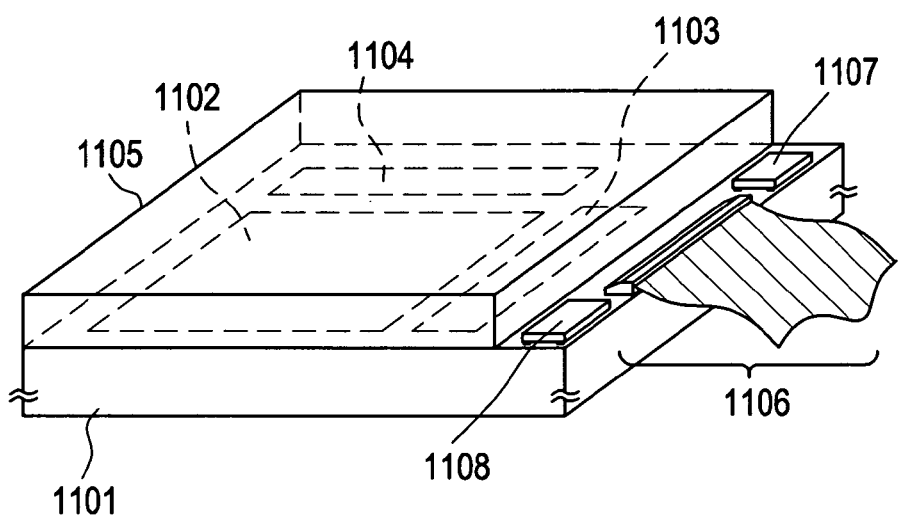
FIGS. 11A and 11B are schematic perspective views of electro-optical device of Example 11 according to the invention.
Figure 11B:
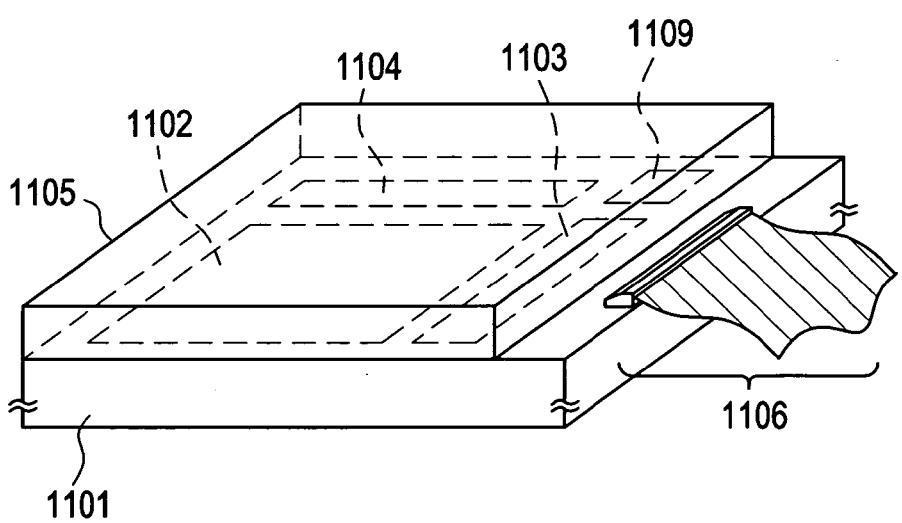

In FIG. 11A, numeral 1101 denotes an active matrix substrate, on which a pixel matrix circuit 1102, a driver circuit on source side 1103 and a driver circuit on gate side 1104 are formed thereon. The driver circuits preferably comprise a CMOS circuit complementarily combining an N-type TFT and a P-type TFT. Numeral 1105 denotes a counter substrate.

In the AMLCD shown in FIG. 11A, the active matrix substrate 1101 and the counter substrate 1105 are joined in such a manner that the edges thereof are arranged, provided that a part of the counter electrode 1105 is removed to expose the active matrix substrate 1101, and an FPC (flexible printed circuit) 1106 is connected thereto. Signals from outside are transferred to the inner circuit by the FPC 1106.

IC chips 1107 and 1108 are mounted utilizing the surface on which the FPC 1106 is attached. These IC chips are constituted by forming various circuit, such as a video signal processing circuit, a timing pulse generating circuit, a gamma compensation circuit, a memory circuit and an operation circuit, on a silicon substrate. While two IC chips are mounted in FIG. 11A, one IC chip or three or more of them may be mounted.

An AMLCD may have the constitution shown in FIG. 11B. In FIG. 11B, the same parts as in FIG. 11A are denoted by the same symbols, respectively. In this constitution, the signal processing that is carried out by the IC chips in FIG. 11A is conducted by a logic circuit 1109 composed of TFT formed on the same substrate 1101. In this case, the logic circuit 1109 is formed based on a CMOS circuit as similar to the driver circuits 1103 and 1104.

While the AMLCD of this example employs a structure in that the black mask is provided on the active matrix substrate (BM on TFT), the structure in that the black mask may be provided on the counter substrate may be employed.

Display in color may be carried out by using a color filter, or by driving the liquid crystal in an ECB (electric field-controlled birefringence) mode or a GH (guest-host) mode without using a color filter.

Furthermore, a constitution using a microlens array as described in Unexamined Published Japanese Patent Application No. 8-15686 may be employed.

EXAMPLE 12

The constitution of the invention may be applied various electro-optical apparatuses and semiconductor circuits in addition to an AMLCD.

Examples of electro-optical apparatuses other than an AMLCD include an EL (electroluminescence) display apparatus and an image sensor.

Examples of semiconductor circuits include an arithmetic processing circuit such as a microprocessor composed of IC chips and a high frequency module handling an input/output signal of a portable apparatus (such as MMIC).

As described in the foregoing, the invention can be applied to any semiconductor apparatus requiring multilayer wiring technique.

EXAMPLE 13

The AMLCD shown in Example 11 can be utilized as a display of various electronic apparatuses. The electronic apparatuses exemplified in this example are defined as a product equipped with an active matrix liquid crystal display device.

Examples of such an electronic apparatus include a camcorder, a still camera, a projection display, a projection television, a head-mounted display, a car navigation system, a personal computer (including a notebook computer) and a portable information terminal (such as a portable computer and a cellular phone). Specific examples thereof are shown in FIGS. 12A through 12F.

Figure 12A:
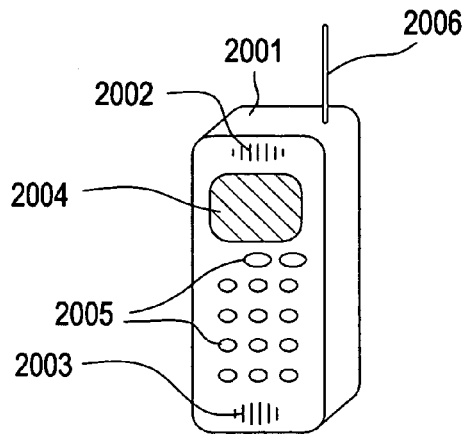
FIGS. 12A to 12F are schematic perspective views of electronic apparatuses of Example 13 according to the invention.

FIG. 12A shows a cellular phone, which is composed of a main body 2001, a sound output part 2002, a sound input part 2003, a display device 2004, an operation switch 2005 and an antenna 2006. The invention can be applied to the display device 2004.

Figure 12B:
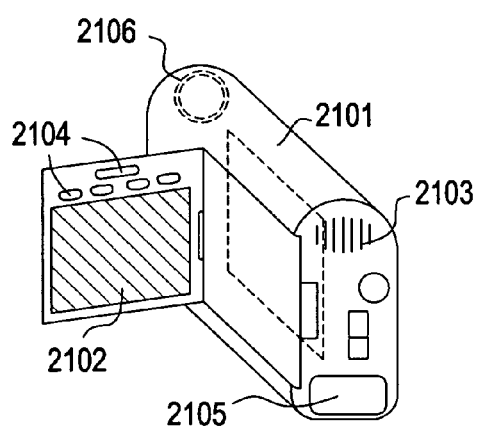

FIG. 12B shows a camcorder, which is composed of a main body 2101, a display device 2102, a sound input part 2103, an operation switch 2104, a battery 2105 and an image receiving part 2106. The invention can be applied to the display device 2102.

Figure 12C:
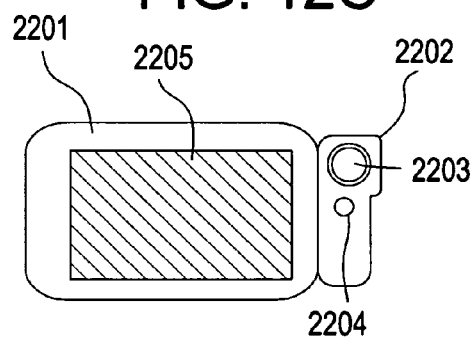

FIG. 12C shows a portable computer, which is composed of a main body 2201, a camera part 2202, an image receiving part 2203, an operation switch 2204 and a display device 2205. The invention can be applied to the display device 2205.

Figure 12D:
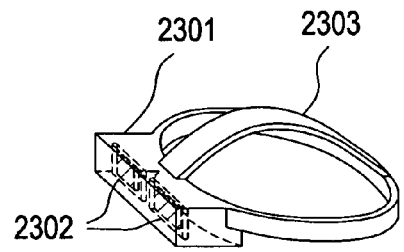

FIG. 12D shows a head mounting display, which is composed of a main body 2301, a display device 2302 and a belt part 2303. The invention can be applied to the display device 2302.

Figure 12E:
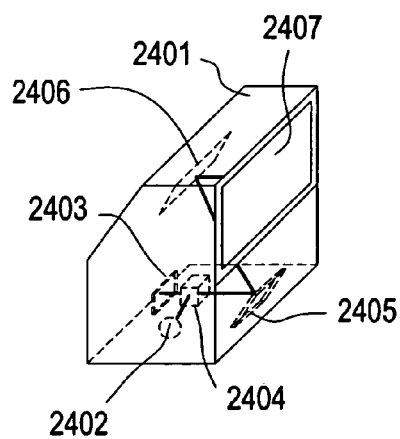

FIG. 12E shows a rear type projector, which is composed of a main body 2401, a light source 2402, a display device 2403, a polarized beam splitter 2404, reflectors 2405 and 2406, and a screen 2406. The invention can be applied to the display device 2403.

Figure 12F:
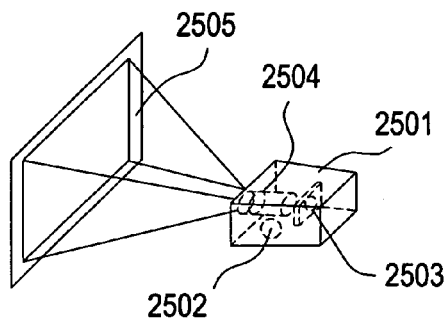

FIG. 12F shows a front type projector, which is composed of a main body 2501, a light source 2502, a display device 2503, an optical system 2504 and a screen 2505. The invention can be applied to the display device 2503.

As described in the foregoing, the field to which the invention can be applied is extremely broad, and the invention can be applied any electronic apparatus of any field. Furthermore, the invention can be applied to an electric display board and an advertisement display.

The invention relates to a technique for realizing a completely flat pixel electrode in each of pixels constituting a pixel matrix circuit of an AMLCD. The constitution of the invention is particularly effective in a reflection type AMLCD in which the whole surface of the pixel electrode becomes an effective display area.

The disclination generating on the pixel electrode can be effectively prevented, and the effective display area is widely enlarged by practicing the invention. Therefore, high contrast can be realized even in an LCD device of higher precision.

What is claimed is:

1. A semiconductor device comprising:
   at least one transistor;
   at least one interlayer insulating film formed over said transistor, said interlayer insulating film having at least one contact hole;
   an embedded conductive layer provided to fill said contact hole wherein a top surface of said embedded conductive layer is flush with a top surface of said interlayer insulating film; and
   a reflective pixel electrode having a flat upper surface thereon, formed on said interlayer insulating film wherein said reflective, pixel electrode is electrically connected to said transistor through said embedded conductive layer,
   wherein the embedded conductive layer comprises a conductive material dispersed in a medium, the conductive material being selected from the group consisting of carbon, zinc oxide, aluminum, and nickel.

2. A device according to claim 1, wherein said medium is an organic material.

3. A device according to claim 1, wherein said medium is an inorganic material.

4. A device according to claim 1, wherein said interlayer insulating film comprises an organic material.

5. A device according to claim 1, wherein said interlayer insulating film comprises an inorganic material.

6. A semiconductor device comprising:
   at least one transistor;
   at least one interlayer insulating film comprising an organic resin formed over said transistor, said interlayer insulating film having at least one contact hole;
   an embedded conductive layer provided to fill said contact hole wherein a top surface of said embedded conductive layer is flush with a top surface of said interlayer insulating film; and
   a reflective pixel electrode having a flat upper surface thereon, formed on said interlayer insulating film wherein said reflective pixel electrode is electrically connected to said transistor through said embedded conductive layer,
   wherein the embedded conductive layer comprises a conductive material dispersed in a medium, the conductive material being selected from the group consisting of carbon, zinc oxide, aluminum, and nickel.

7. A device according to claim 6, wherein said medium is an organic material.

8. A device according to claim 6, wherein said medium is an inorganic material.

9. A semiconductor device comprising:
   at least one transistor;
   a first interlayer insulating film formed over said transistor;
   a drain electrode formed on said first interlayer insulating film and electrically connected to a drain of said transistor through an opening of said first interlayer insulating film;
   a second interlayer insulating film formed over said drain electrode and said first interlayer insulating film;
   a capacitor forming electrode formed on said second interlayer insulating film to form a capacitor between said drain electrode and said capacitor forming electrode;
   a third interlayer insulating film formed over said capacitor forming electrode and said second interlayer insulating film;
   a contact hole opened through said third and second interlayer insulating films to reach said drain electrode;
   an embedded conductive layer filled in said contact hole; and
   a reflective pixel electrode formed on said third interlayer insulating film, wherein said reflective pixel electrode is electrically connected to said drain electrode through said embedded conductive layer, wherein a cross sectional shape of the contact hole is tapered, and wherein the embedded conductive layer comprises a conductive material dispersed in a medium, the conductive material being selected from the group consisting of carbon, zinc oxide, aluminum, and nickel.

10. A device according to claim 9, wherein said medium is an organic material.

11. A device according to claim 9, wherein said medium is an inorganic material.

12. A device according to claim 9, wherein said interlayer insulating film comprises an organic material.

13. A device according to claim 9, wherein said interlayer insulating film comprises an inorganic material.

14. A semiconductor device comprising:
at least one transistor;
a first interlayer insulating film formed over said transistor;
a drain electrode formed on said first interlayer insulating film and electrically connected to a drain of said transistor through an opening of said first interlayer insulating film;
a second interlayer insulating film formed over said drain electrode and said first interlayer insulating film;
a capacitor forming electrode formed on said second interlayer insulating film to form a capacitor between said drain electrode and said capacitor forming electrode;
a third interlayer insulating film comprising an organic resin formed over said capacitor forming electrode and said second interlayer insulating film;
a contact hole opened through said third and second interlayer insulating films to reach said drain electrode;
an embedded conductive layer filled in said contact hole; and
a reflective pixel electrode formed on said third interlayer insulating film, wherein said reflective pixel electrode is electrically connected to said drain electrode through said embedded conductive layer,
wherein a cross sectional shape of the contact hole is tapered, and
wherein the embedded conductive layer comprises a conductive material dispersed in a medium, the conductive material being selected from the group consisting of carbon, zinc oxide, aluminum, and nickel.

15. A device according to claim 14, wherein said medium is an organic material.

16. A device according to claim 14, wherein said medium is an inorganic material.

17. A semiconductor device comprising:
at least one transistor;
a first interlayer insulating film comprising an organic resin formed over said transistor, said interlayer insulating film having at least one contact hole;
an embedded conductive layer provided to fill said contact hole wherein a top surface of said embedded conductive layer is flush with a top surface of said interlayer insulating film; and
a reflective pixel electrode having a flat upper surface thereon, formed on said interlayer insulating film wherein said reflective pixel electrode is electrically connected to said transistor through said embedded conductive layer, wherein said embedded conductive layer comprises a same resin as said resin of the interlayer insulating film.

18. The semiconductor device according to claim 17 wherein said third interlayer insulating film and said embedded conductive layer both comprise an acrylic resin.

19. A semiconductor device comprising:
at least one transistor;
at least one interlayer insulating film formed over said transistor, said interlayer insulating film having at least one contact hole;
an embedded conductive layer provided to fill said contact hole wherein a top surface of said embedded conductive layer is flush with a top surface of said interlayer insulating film; and
a reflective pixel electrode having a flat upper surface thereon, formed on said interlayer insulating film wherein said reflective pixel electrode is electrically connected to said transistor through said embedded conductive layer, wherein said embedded conductive layer comprises an indium tin oxide.

20. A device according to claim 19, wherein said interlayer insulating film comprises an organic material.

21. A device according to claim 19, wherein said interlayer insulating film comprises an inorganic material.

22. A device according to claim 19, wherein said interlayer insulating film comprises an inorganic material.

23. A device according to claim 19, wherein said interlayer insulating film comprises an organic material.

24. A semiconductor device comprising:
at least one transistor;
at least one interlayer insulating film comprising an organic resin formed over said transistor, said interlayer insulating film having at least one contact hole;
an embedded conductive layer provided to fill said contact hole wherein a top surface of said embedded conductive layer is flush with a top surface of said interlayer insulating film; and
a reflective pixel electrode having a flat upper surface thereon, formed on said interlayer insulating film wherein said reflective pixel electrode is electrically connected to said transistor through said embedded conductive layer,
wherein said embedded conductive layer comprises an indium tin oxide.

25. A device according to claim 24, wherein said interlayer insulating film comprises an organic material.

26. A device according to claim 24, wherein said interlayer insulating film comprises an inorganic material.

27. A semiconductor device comprising:
at least one transistor;
a first interlayer insulating film formed over said transistor;
a drain electrode formed on said first interlayer insulating film and electrically connected to a drain of said transistor through an opening of said first interlayer insulating film;
a second interlayer insulating film formed over said drain electrode and said first interlayer insulating film;
a capacitor forming electrode formed on said second interlayer insulating film to form a capacitor between said drain electrode and said capacitor forming electrode;
a third interlayer insulating film formed over said capacitor forming electrode and said second interlayer insulating film;
a contact hole opened through said third and second interlayer insulating films to reach said drain electrode;
an embedded conductive layer filled in said contact hole; and a reflective pixel electrode formed on said third interlayer insulating film, wherein said reflective pixel electrode is electrically connected to said drain electrode through said embedded conductive layer, wherein a cross sectional shape of the contact hole is tapered, and wherein said embedded conductive layer comprises an indium tin oxide.

28. A device according to claim 27, wherein at least one of said second and third interlayer insulating films comprises an organic material.

29. A device according to claim 27, wherein said first interlayer insulating film comprises an inorganic material.

30. A device according to claim 27, wherein said interlayer insulating film comprises an inorganic material.

31. A device according to claim 27, wherein said interlayer insulating film comprises an organic material.

32. A semiconductor device comprising:
at least one transistor;
a first interlayer insulating film formed over said transistor;
a drain electrode formed on said first interlayer insulating film and electrically connected to a drain of said transistor through an opening of said first interlayer insulating film;
a second interlayer insulating film formed over said drain electrode and said first interlayer insulating film;
a capacitor forming electrode formed on said second interlayer insulating film to form a capacitor between said drain electrode and said capacitor forming electrode;
a third interlayer insulating film comprising an organic resin formed over said capacitor forming electrode and said second interlayer insulating film;
a contact hole opened through said third and second interlayer insulating films to reach said drain electrode;
an embedded conductive layer filled in said contact hole; and
a reflective pixel electrode formed on said third interlayer insulating film, wherein said reflective pixel electrode is electrically connected to said drain electrode through said embedded conductive layer, wherein a cross sectional shape of the contact hole is tapered, and wherein said embedded conductive layer comprises an indium tin oxide.

33. A device according to claim 32, wherein at least one of said second and third interlayer insulating films comprises an organic material.

34. A device according to claim 32 wherein said first interlayer insulating film comprises an inorganic material.

35. A semiconductor device according to any one of claims 1, 19, 24, 27, and 32, further comprising an alignment film.

36. A semiconductor device according to claim 1, 6, 9, 14, 17, 19, 24, 27, or 32, wherein said device is a display device of a cellular phone.

37. A semiconductor device according to claim 1, 6, 9, 14, 17, 19, 24, 27, or 32, wherein said device is a display device of a camcorder.

38. A semiconductor device according to claim 1, 6, 9, 14, 17, 19, 24, 27, or 32, wherein said device is a display device of a portable computer.

39. A semiconductor device according to claim 1, 6, 9, 14, 17, 19, 24, 27, or 32, wherein said device is a display device of a head mounting display.

40. A semiconductor device according to claim 1, 6, 9, 14, 17, 19, 24, 27, or 32, wherein said device is a display device of a rear type projector.

41. A semiconductor device according to claim 1, 6, 9, 14, 17, 19, 24, 27, and 32, wherein said device is a display device of a front type projector.

42. A semiconductor device according to any one of claim 1, 19, 24, 27, and 32, wherein said device is an EL display device.

* * * * *